United States Patent
Kim et al.

(10) Patent No.: US 10,931,311 B2
(45) Date of Patent: Feb. 23, 2021

(54) METHOD FOR ENCODING AND TRANSMITTING PBCH AND COMMUNICATION DEVICE THEREFOR

(71) Applicant: LG Electronics Inc., Seoul (KR)

(72) Inventors: Bonghoe Kim, Seoul (KR); Kwangseok Noh, Seoul (KR); Hyunsoo Ko, Seoul (KR); Ilmu Byun, Seoul (KR); Seunggye Hwang, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 16/475,625

(22) PCT Filed: Jan. 2, 2018

(86) PCT No.: PCT/KR2018/000015
§ 371 (c)(1),
(2) Date: Jul. 2, 2019

(87) PCT Pub. No.: WO2018/128341
PCT Pub. Date: Jul. 12, 2018

(65) Prior Publication Data
US 2019/0326934 A1    Oct. 24, 2019

Related U.S. Application Data

(60) Provisional application No. 62/538,049, filed on Jul. 28, 2017, provisional application No. 62/518,526, (Continued)

(51) Int. Cl.
*G01R 31/28* (2006.01)
*H03M 13/13* (2006.01)
(Continued)

(52) U.S. Cl.
CPC .......... *H03M 13/13* (2013.01); *H04L 1/0057* (2013.01); *H04L 1/0061* (2013.01);
(Continued)

(58) Field of Classification Search
CPC .... H03M 13/13; H04L 1/0057; H04L 1/0061; H04L 1/0071; H04W 72/005; H04W 72/0446
See application file for complete search history.

(56) References Cited

U.S. PATENT DOCUMENTS

2016/0182187 A1   6/2016   Kim et al.
2016/0241357 A1   8/2016   Jeong et al.
(Continued)

FOREIGN PATENT DOCUMENTS

KR    1020140077492    6/2014
KR    1020160054490    5/2016

OTHER PUBLICATIONS

PCT International Search Report and Written Opinion in International Application No. PCT/KR2018/000015, dated Apr. 30, 2018, 24 pages (with English translation).

*Primary Examiner* — Samir W Rizk
(74) *Attorney, Agent, or Firm* — Fish & Richardson P.C.

(57) ABSTRACT

A method by which a base station transmits a physical broadcast channel (PBCH) can comprise the steps of: generating the same encoded data bit for each of two symbols of a predetermined subframe for PBCH transmission by using a polar code; and transmitting the generated same encoded data bit from each of the two symbols of the predetermined subframe through the PBCH.

8 Claims, 20 Drawing Sheets

Related U.S. Application Data filed on Jun. 12, 2017, provisional application No. 62/479,407, filed on Mar. 31, 2017, provisional application No. 62/441,595, filed on Jan. 3, 2017.

(51) Int. Cl.
  *H04L 1/00* (2006.01)
  *H04W 72/00* (2009.01)
  *H04W 72/04* (2009.01)

(52) U.S. Cl.
  CPC ......... *H04L 1/0071* (2013.01); *H04W 72/005* (2013.01); *H04W 72/0446* (2013.01)

(56) References Cited

U.S. PATENT DOCUMENTS

| | | | |
|---|---|---|---|
| 2016/0248547 A1 | 8/2016 | Shen et al. | |
| 2017/0289971 A1* | 10/2017 | Wu | H04W 72/0453 |
| 2018/0026663 A1* | 1/2018 | Wu | H03M 13/6362 |
| | | | 714/776 |

* cited by examiner

FIG. 9
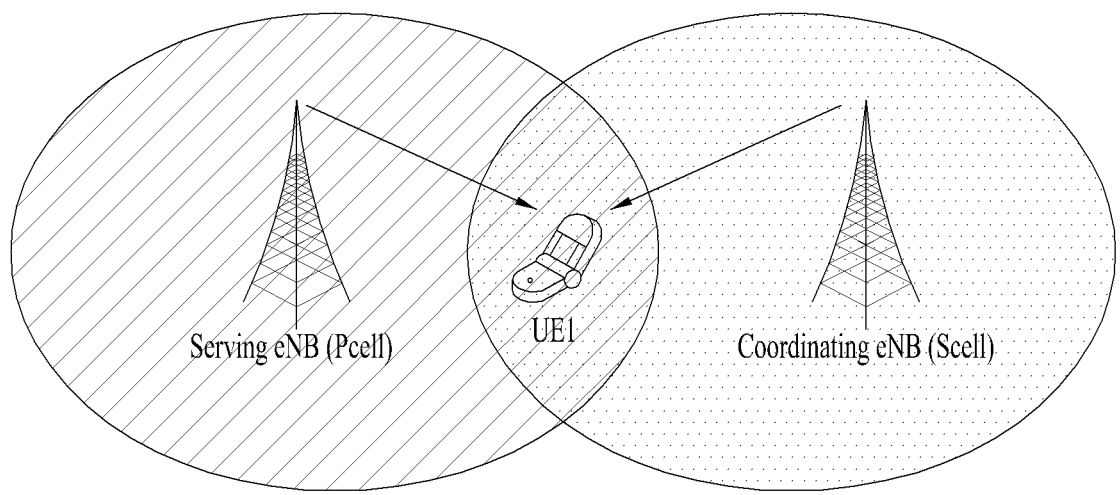
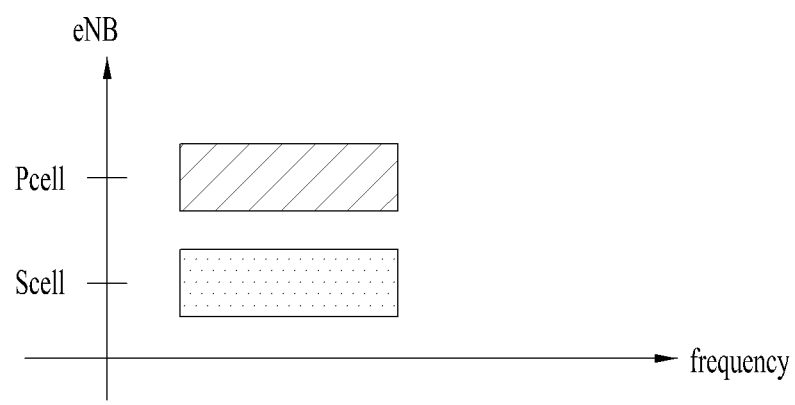

FIG. 17a

| | | | | | | | |
|---|---|---|---|---|---|---|---|
| | | | | | | | Mother code size, 512 bit |
| | | | | | | | 1/8 PBCH encoded bit, 384 bit |
| | | | | | | | PBCH_sub(1), 768 bit |
| | | | | | | Option 1 | PBCH_sub(2), 768 bit |
| | | | | | | | PBCH_sub(3), 768 bit |
| | | | | | | | PBCH_sub(4), 768 bit |

FIG. 17b

| | | | | | | | |
|---|---|---|---|---|---|---|---|
| | | | | | | | Mother code size, 512 bit |
| | | | | | | | 1/8 PBCH encoded bit, 384 bit |
| | | | | | | | PBCH_sub(1), 768 bit |
| | | | | | | Option 2 | PBCH_sub(2), 768 bit |
| | | | | | | | PBCH_sub(3), 768 bit |
| | | | | | | | PBCH_sub(4), 768 bit |

FIG. 18a

| | | | | | | | | |
|---|---|---|---|---|---|---|---|---|
| | | | | | | | | Mother code size, 512 bit |
| | | | | | | | | 1/8 PBCH encoded bit, 384 bit |
| | | | | | | | | PBCH_sub(1), 768 bit |
| | | | | | | | | PBCH_sub(2), 768 bit |
| | | | | | | | | PBCH_sub(3), 768 bit |
| | | | | | | | Option 1-1 | PBCH_sub(4), 768 bit |
| | | | | | | | | PBCH_sub(5), 768 bit |
| | | | | | | | | PBCH_sub(6), 768 bit |
| | | | | | | | | PBCH_sub(7), 768 bit |
| | | | | | | | | PBCH_sub(8), 768 bit |

FIG. 18b

| | | | | | | | | |
|---|---|---|---|---|---|---|---|---|
| | | | | | | | | Mother code size, 512 bit |
| | | | | | | | | 1/8 PBCH encoded bit, 384 bit |
| | | | | | | | | PBCH_sub(1), 768 bit |
| | | | | | | | | PBCH_sub(2), 768 bit |
| | | | | | | | | PBCH_sub(3), 768 bit |
| | | | | | | | Option 1-2 | PBCH_sub(4), 768 bit |
| | | | | | | | | PBCH_sub(5), 768 bit |
| | | | | | | | | PBCH_sub(6), 768 bit |
| | | | | | | | | PBCH_sub(7), 768 bit |
| | | | | | | | | PBCH_sub(8), 768 bit |

FIG. 18c

| | | | | | | | |
|---|---|---|---|---|---|---|---|
| | | | | | | | Mother code size, 512 bit |
| | | | | | | | 1/8 PBCH encoded bit, 384 bit |
| | | | | | | | |
| | | | | | | | PBCH_sub(1), 768 bit |
| | | | | | | | PBCH_sub(2), 768 bit |
| | | | | | | | PBCH_sub(3), 768 bit |
| | | | | | | | PBCH_sub(4), 768 bit |
| | | | | | | Option 2 | PBCH_sub(5), 768 bit |
| | | | | | | | PBCH_sub(6), 768 bit |
| | | | | | | | PBCH_sub(7), 768 bit |
| | | | | | | | PBCH_sub(8), 768 bit |

METHOD FOR ENCODING AND TRANSMITTING PBCH AND COMMUNICATION DEVICE THEREFOR

CROSS-REFERENCE TO RELATED APPLICATIONS

This application is a National Stage application under 35 U.S.C. § 371 of International Application No. PCT/KR2018/000015, filed on Jan. 2, 2018, which claims the benefit of U.S. Provisional Application No. 62/538,049, filed on Jul. 28, 2017, U.S. Provisional Application No. 62/518,526, filed on Jun. 12, 2017, U.S. Provisional Application No. 62/479,407, filed on Mar. 31, 2017, and U.S. Provisional Application No. 62/441,595, filed on Jan. 3, 2017. The disclosures of the prior applications are incorporated by reference in their entirety.

TECHNICAL FIELD

The present invention relates to wireless communication, and more particularly, to a method for encoding and transmitting a PBCH and a communication device therefor.

BACKGROUND ART

In the next generation 5G system, Wireless Sensor Network (WSN) and Massive Machine Type Communication (MTC) that intermittently transmit small packets targeting massive connection/low cost/low power services are considered.

Massive MTC services have very limited connection density requirements, while having very flexible data rate and end-to-end (E2E) latency requirements (e.g., connection density of up to 200,000/km$^2$, E2E latency ranging from several seconds to several hours, DL/UL data rate typically ranging from 1 to 100 kbps).

DISCLOSURE OF THE INVENTION

Technical Task

An object of the present invention is to provide a method for transmitting a physical broadcast channel (PBCH) by a base station.

Another object of the present invention is to provide a method for receiving a PBCH by a terminal.

Another object of the present invention is to provide a base station for transmitting a PBCH.

Another object of the present invention is to provide a terminal for receiving a PBCH.

It will be appreciated by persons skilled in the art that the objects that could be achieved with the present disclosure are not limited to what has been particularly described hereinabove and the above and other objects that the present disclosure could achieve will be more clearly understood from the following detailed description.

Technical Solutions

In an aspect of the present invention, provided herein a method for transmitting a physical broadcast channel (PBCH) by a base station, the method including generating same encoded data bits for each of two symbols of a predetermined subframe for PBCH transmission using a polar code, and transmitting the generated same encoded data bits on the PBCH at each of the two symbols of the predetermined subframe.

The generating may include generating the same encoded data bits based on an information size of the PBCH and a mother code size of a polar encoder.

The generating may include when a mother code size of a polar encoder is greater than a size of the same encoded date bits transmitted at each of the two symbols, generating the same encoded data bits by puncturing bits of a size corresponding to a difference between a mother code size and a size of the same encoded data bits among the generated encoded data bits of mother code size.

The mother code size of the polar encoder may be 512 and a size of the same encoded date bits may be 384.

In another aspect of the present invention, provided herein is a method for receiving a physical broadcast channel (PBCH) by a user equipment, the method including receiving generated same encoded data bits on the PBCH at each of two symbols of a predetermined subframe, wherein the generated encoded data bits are generated for each of the two symbols of the predetermined subframe for PBCH transmission using a polar code.

In another aspect of the present invention, provided herein is a base station for transmitting a physical broadcast channel (PBCH), including a polar encoder configured to generate same encoded data bits for each of two symbols of a predetermined subframe for PBCH transmission using a polar code, and a transmitter configured to transmit the generated same encoded data bits on the PBCH at each of the two symbols of the predetermined subframe.

The polar encoder may be configured to generate the same encoded data bit based on an information size of the PBCH and a mother code size of the polar encoder.

When a mother code size of a polar encoder is greater than a size of the same encoded date bits transmitted at each of the two symbol, the polar encoder may be configured to generate the same encoded data bits by puncturing bits of a size corresponding to a difference between a mother code size and a size of the same encoded data bits among the generated encoded data bits of mother code size.

The mother code size of the polar encoder may be 512 and a size of the same encoded date bits may be 384.

In another aspect of the present invention, provided herein is a user equipment for receiving a physical broadcast channel (PBCH), the user equipment including a receiver, and a processor configured to control the receiver to receive generated same encoded data bits on the PBCH at each of two symbols of a predetermined subframe, wherein the generated encoded data bits are generated for each of the two symbols of the predetermined subframe for PBCH transmission using a polar code.

Advantageous Effects

A method for encoding and transmitting a PBCH according to an embodiment of the present invention may improve PBCH transmission/reception performance and communication performance by lowering the complexity of an encoder/decoder.

The effects that can be achieved through the embodiments of the present disclosure are not limited to what has been particularly described hereinabove and other effects which are not described herein can be derived by those skilled in the art from the following detailed description. That is, it should be noted that the effects which are not intended by the present disclosure can be derived by those skilled in the art from the embodiments of the present disclosure.

DESCRIPTION OF DRAWINGS

The accompanying drawings, which are included to provide a further understanding of the invention and are incorporated in and constitute a part of this specification, illustrate embodiments of the invention.

FIG. 9 is a conceptual diagram of a CoMP system operating based on a CA environment.

FIGS. 17A and 17B illustrate embodiments of a PBCH transmission scheme when four transmission occasions are given, and FIGS. 18A, 18B and 18C illustrate embodiments of a PBCH transmission scheme when eight transmission occasions are given.

MODE FOR INVENTION

Figure 1:
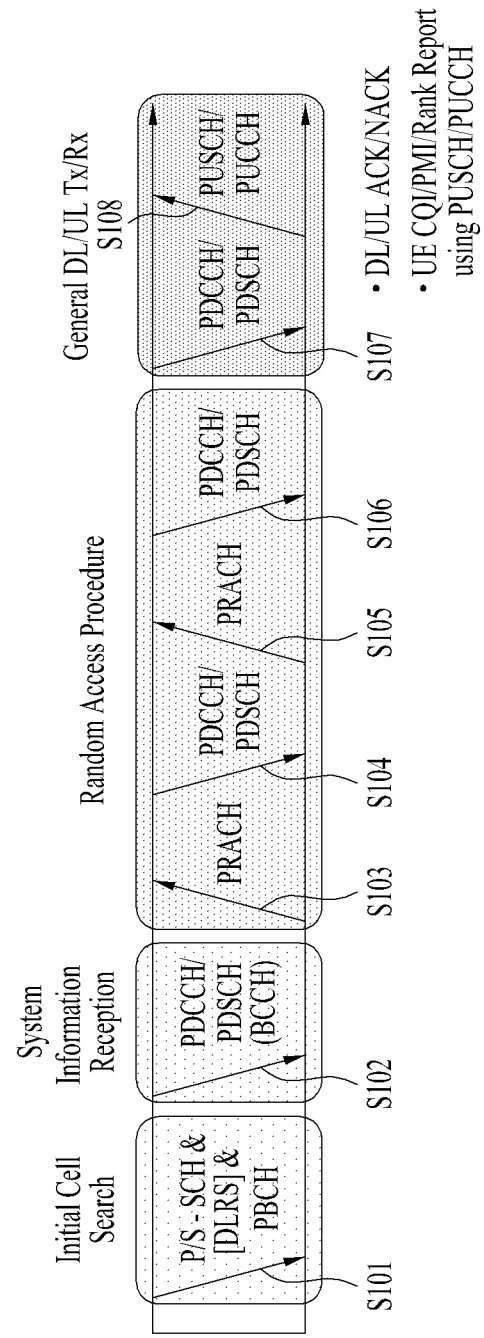
FIG. 1 is a diagram illustrating physical channels and a signal transmission method using the physical channels.

Embodiments of the invention, which are described in detail below, provide methods and apparatuses for using heterogeneous network signals to measure the location of a terminal.

The embodiments of the present invention described below are combinations of elements and features of the present invention in specific forms. The elements or features may be considered selective unless otherwise mentioned. Each element or feature may be practiced without being combined with other elements or features. Further, an embodiment of the present invention may be constructed by combining parts of the elements and/or features. Operation orders described in embodiments of the present invention may be rearranged. Some constructions or elements of any one embodiment may be included in another embodiment and may be replaced with corresponding constructions or features of another embodiment.

In the description of the attached drawings, a detailed description of known procedures or steps of the present invention will be avoided lest it should obscure the subject matter of the present invention. In addition, procedures or steps that could be understood to those skilled in the art will not be described either.

Throughout the specification, when a certain portion "includes" or "comprises" a certain component, this indicates that other components are not excluded and may be further included unless otherwise noted. The terms "unit", "-or/er" and "module" used in the specification indicate a unit for processing at least one function or operation, which may be implemented by hardware, software or a combination thereof. In addition, the terms "a or an", "one", "the" etc. may include a singular representation and a plural representation in the context of the present disclosure (more particularly, in the context of the following claims) unless indicated otherwise in the specification or unless context clearly indicates otherwise.

In the embodiments of the present invention, a description is mainly made of a data transmission and reception relationship between a Base Station (BS) and a User Equipment (UE). A BS refers to a terminal node of a network, which directly communicates with a UE. A specific operation described as being performed by the BS may be performed by an upper node of the BS.

Namely, it is apparent that, in a network comprised of a plurality of network nodes including a BS, various operations performed for communication with a UE may be performed by the BS, or network nodes other than the BS. The term 'BS' may be replaced with a fixed station, a Node B, an evolved Node B (eNode B or eNB), an Advanced Base Station (ABS), an access point, etc.

In the embodiments of the present invention, the term terminal may be replaced with a UE, a Mobile Station (MS), a Subscriber Station (SS), a Mobile Subscriber Station (MSS), a mobile terminal, an Advanced Mobile Station (AMS), etc.

A transmitter is a fixed and/or mobile node that provides a data service or a voice service and a receiver is a fixed and/or mobile node that receives a data service or a voice service. Therefore, a UE may serve as a transmitter and a BS may serve as a receiver, on an UpLink (UL). Likewise, the UE may serve as a receiver and the BS may serve as a transmitter, on a DL.

The embodiments of the present invention may be supported by standard specifications disclosed for at least one of wireless access systems including an Institute of Electrical and Electronics Engineers (IEEE) 802.xx system, a 3rd Generation Partnership Project (3GPP) system, a 3GPP Long Term Evolution (LTE) system, and a 3GPP2 system. In particular, the embodiments of the present invention may be supported by the standard specifications, 3GPP TS 36.211, 3GPP TS 36.212, 3GPP TS 36.213, and 3GPP TS 36.321. That is, the steps or parts, which are not described to clearly reveal the technical idea of the present invention, in the embodiments of the present invention may be explained by the above standard specifications. All terms used in the embodiments of the present invention may be explained by the standard specifications.

Reference will now be made in detail to the preferred embodiments of the present invention with reference to the accompanying drawings. The detailed description, which will be given below with reference to the accompanying drawings, is intended to explain exemplary embodiments of the present invention, rather than to show the only embodiments that can be implemented according to the invention.

The following detailed description includes specific terms in order to provide a thorough understanding of the present invention. However, it will be apparent to those skilled in the art that the specific terms may be replaced with other terms without departing the technical scope of the present invention.

Hereinafter, a 3GPP LTE/LTE-A system will be described as an example of radio access systems in which embodiments of the present invention can be used.

The embodiments of the present invention can be applied to various wireless access systems such as Code Division Multiple Access (CDMA), Frequency Division Multiple Access (FDMA), Time Division Multiple Access (TDMA), Orthogonal Frequency Division Multiple Access (OFDMA), Single Carrier Frequency Division Multiple Access (SC-FDMA), etc. CDMA may be implemented as a radio technology such as Universal Terrestrial Radio Access (UTRA) or CDMA2000. TDMA may be implemented as a radio technology such as Global System for Mobile communications (GSM)/General packet Radio Service (GPRS)/Enhanced Data Rates for GSM Evolution (EDGE). OFDMA may be implemented as a radio technology such as IEEE 802.11 (Wi-Fi), IEEE 802.16 (WiMAX), IEEE 802.20, Evolved UTRA (E-UTRA), etc.

UTRA is a part of Universal Mobile Telecommunications System (UMTS). 3GPP LTE is a part of Evolved UMTS (E-UMTS) using E-UTRA, adopting OFDMA for DL and SC-FDMA for UL. LTE-Advanced (LTE-A) is an evolution of 3GPP LTE. While the embodiments of the present invention are described in the context of a 3GPP LTE/LTE-A system in order to clarify the technical features of the present invention, the present invention is also applicable to an IEEE 802.16e/m system, etc.

1. 3GPP LTE/LTE-A System

In a wireless access system, a UE receives information from an eNB on a DL and transmits information to the eNB on a UL. The information transmitted and received between the UE and the eNB includes general data information and various types of control information. There are many physical channels according to the types/usages of information transmitted and received between the eNB and the UE.

1.1 System Overview

FIG. 1 illustrates physical channels and a general method using the physical channels, which may be used in embodiments of the present invention.

When a UE is powered on or enters a new cell, the UE performs initial cell search (S11). The initial cell search involves acquisition of synchronization to an eNB. Specifically, the UE synchronizes its timing to the eNB and acquires information such as a cell Identifier (ID) by receiving a Primary Synchronization Channel (P-SCH) and a Secondary Synchronization Channel (S-SCH) from the eNB.

Then the UE may acquire information broadcast in the cell by receiving a Physical Broadcast Channel (PBCH) from the eNB.

During the initial cell search, the UE may monitor a DL channel state by receiving a Downlink Reference Signal (DL RS).

After the initial cell search, the UE may acquire more detailed system information by receiving a Physical Downlink Control Channel (PDCCH) and receiving a Physical Downlink Shared Channel (PDSCH) based on information of the PDCCH (S12).

To complete connection to the eNB, the UE may perform a random access procedure with the eNB (S13 to S16). In the random access procedure, the UE may transmit a preamble on a Physical Random Access Channel (PRACH) (S13) and may receive a PDCCH and a PDSCH associated with the PDCCH (S14). In the case of contention-based random access, the UE may additionally perform a contention resolution procedure including transmission of an additional PRACH (S15) and reception of a PDCCH signal and a PDSCH signal corresponding to the PDCCH signal (S16).

After the above procedure, the UE may receive a PDCCH and/or a PDSCH from the eNB (S17) and transmit a Physical Uplink Shared Channel (PUSCH) and/or a Physical Uplink Control Channel (PUCCH) to the eNB (S18), in a general UL/DL signal transmission procedure.

Control information that the UE transmits to the eNB is generically called Uplink Control Information (UCI). The UCI includes a Hybrid Automatic Repeat and reQuest Acknowledgement/Negative Acknowledgement (HARQ-ACK/NACK), a Scheduling Request (SR), a Channel Quality Indicator (CQI), a Precoding Matrix Index (PMI), a Rank Indicator (RI), etc.

In the LTE system, UCI is generally transmitted on a PUCCH periodically. However, if control information and traffic data should be transmitted simultaneously, the control information and traffic data may be transmitted on a PUSCH. In addition, the UCI may be transmitted aperiodically on the PUSCH, upon receipt of a request/command from a network.

Figure 2:
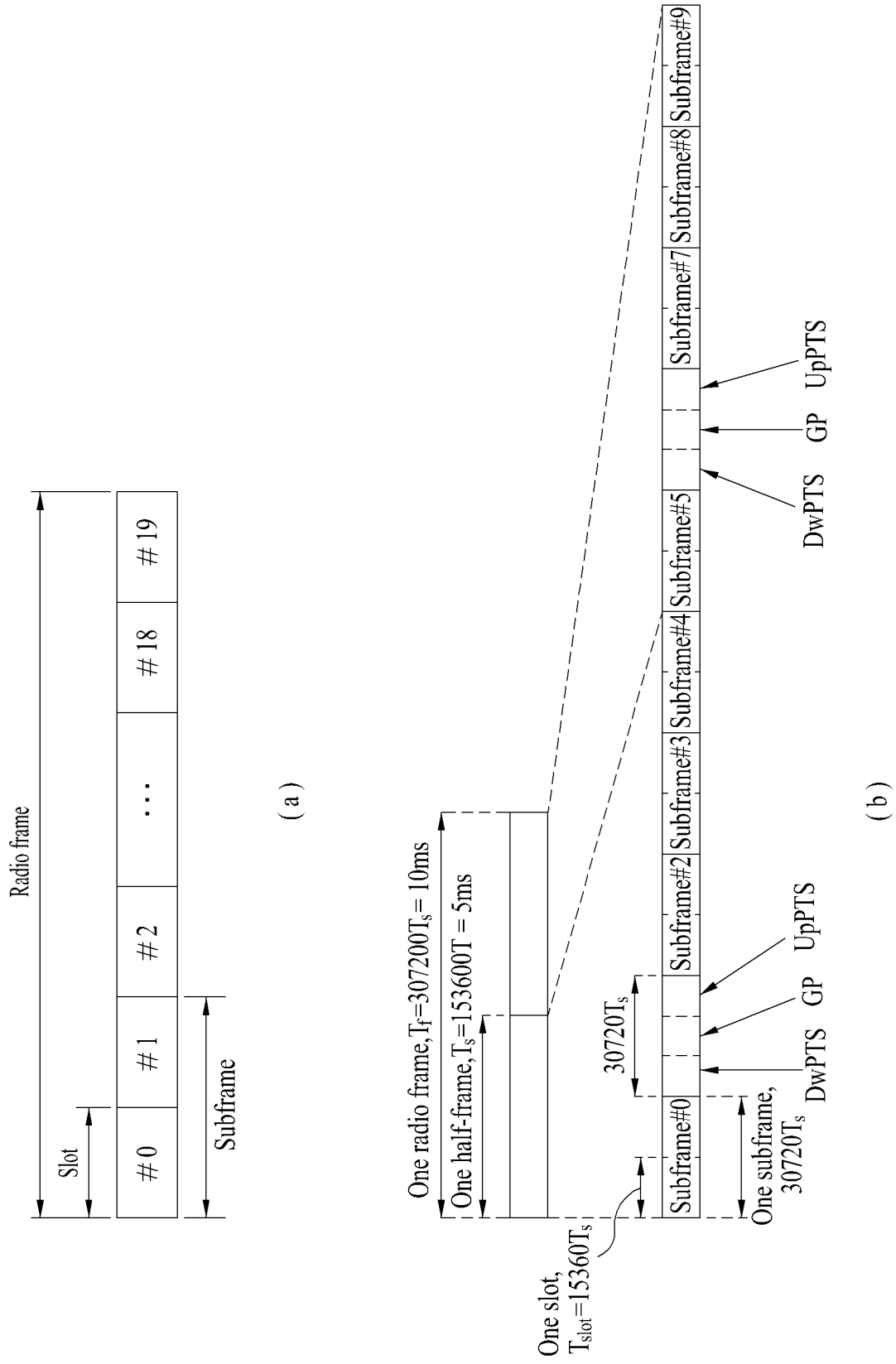
FIG. 2 is a diagram illustrating exemplary radio frame structures.

FIG. 2 illustrates exemplary radio frame structures used in embodiments of the present invention.

FIG. 2(a) illustrates frame structure type 1. Frame structure type 1 is applicable to both a full Frequency Division Duplex (FDD) system and a half FDD system.

One radio frame is 10 ms ($T_f=307200 \cdot T_s$) long, including equal-sized 20 slots indexed from 0 to 19. Each slot is 0.5 ms ($T_{slot}=15360 \cdot T_s$) long. One subframe includes two successive slots. An $i^{th}$ subframe includes $2i^{th}$ and $(2i+1)^{th}$ slots. That is, a radio frame includes 10 subframes. A time required for transmitting one subframe is defined as a Transmission Time Interval (TTI). $T_s$ is a sampling time given as $T_s=1/(15 \text{ kHz} \times 2048)=3.2552 \times 10^{-8}$ (about 33 ns). One slot includes a plurality of Orthogonal Frequency Division Multiplexing (OFDM) symbols or SC-FDMA symbols in the time domain by a plurality of Resource Blocks (RBs) in the frequency domain.

A slot includes a plurality of OFDM symbols in the time domain. Since OFDMA is adopted for DL in the 3GPP LTE system, one OFDM symbol represents one symbol period. An OFDM symbol may be called an SC-FDMA symbol or symbol period. An RB is a resource allocation unit including a plurality of contiguous subcarriers in one slot.

In a full FDD system, each of 10 subframes may be used simultaneously for DL transmission and UL transmission during a 10-ms duration. The DL transmission and the UL transmission are distinguished by frequency. On the other hand, a UE cannot perform transmission and reception simultaneously in a half FDD system.

The above radio frame structure is purely exemplary. Thus, the number of subframes in a radio frame, the number of slots in a subframe, and the number of OFDM symbols in a slot may be changed.

FIG. 2(b) illustrates frame structure type 2. Frame structure type 2 is applied to a Time Division Duplex (TDD) system. One radio frame is 10 ms ($T_f=307200 \cdot T_s$) long, including two half-frames each having a length of 5 ms (=153600·$T_s$) long. Each half-frame includes five subframes each being 1 ms (=30720·$T_s$) long. An $i^{th}$ subframe includes $2i^{th}$ and $(2i+1)^{th}$ slots each having a length of 0.5 ms ($T_{slot}$=15360·$T_s$). $T_s$ is a sampling time given as $T_s$=1/(15 kHz×2048)=3.2552×10$^{-8}$ (about 33 ns).

A type-2 frame includes a special subframe having three fields, Downlink Pilot Time Slot (DwPTS), Guard Period (GP), and Uplink Pilot Time Slot (UpPTS). The DwPTS is used for initial cell search, synchronization, or channel estimation at a UE, and the UpPTS is used for channel estimation and UL transmission synchronization with a UE at an eNB. The GP is used to cancel UL interference between a UL and a DL, caused by the multi-path delay of a DL signal.

Table 1 below lists special subframe configurations (DwPTS/GP/UpPTS lengths).

TABLE 1

| | Normal cyclic prefix in downlink | | | Extended cyclic prefix in downlink | | |
| | | UpPTS | | | UpPTS | |
| Special subframe configuration | DwPTS | Normal cyclic prefix in uplink | Extended cyclic prefix in uplink | DwPTS | Normal cyclic prefix in uplink | Extended cyclic prefix in uplink |
| --- | --- | --- | --- | --- | --- | --- |
| 0 | 6592 · $T_s$ | 2192 · $T_s$ | 2560 · $T_s$ | 7680 · $T_s$ | 2192 · $T_s$ | 2560 · $T_s$ |
| 1 | 19760 · $T_s$ | | | 20480 · $T_s$ | | |
| 2 | 21952 · $T_s$ | | | 23040 · $T_s$ | | |
| 3 | 24144 · $T_s$ | | | 25600 · $T_s$ | | |
| 4 | 26336 · $T_s$ | | | 7680 · $T_s$ | 4384 · $T_s$ | 5120 · $T_s$ |
| 5 | 6592 · $T_s$ | 4384 · $T_s$ | 5120 · $T_s$ | 20480 · $T_s$ | | |
| 6 | 19760 · $T_s$ | | | 23040 · $T_s$ | | |
| 7 | 21952 · $T_s$ | | | 12800 · $T_s$ | | |
| 8 | 24144 · $T_s$ | | | — | — | — |
| 9 | 13168 · $T_s$ | | | — | — | — |

Figure 3:
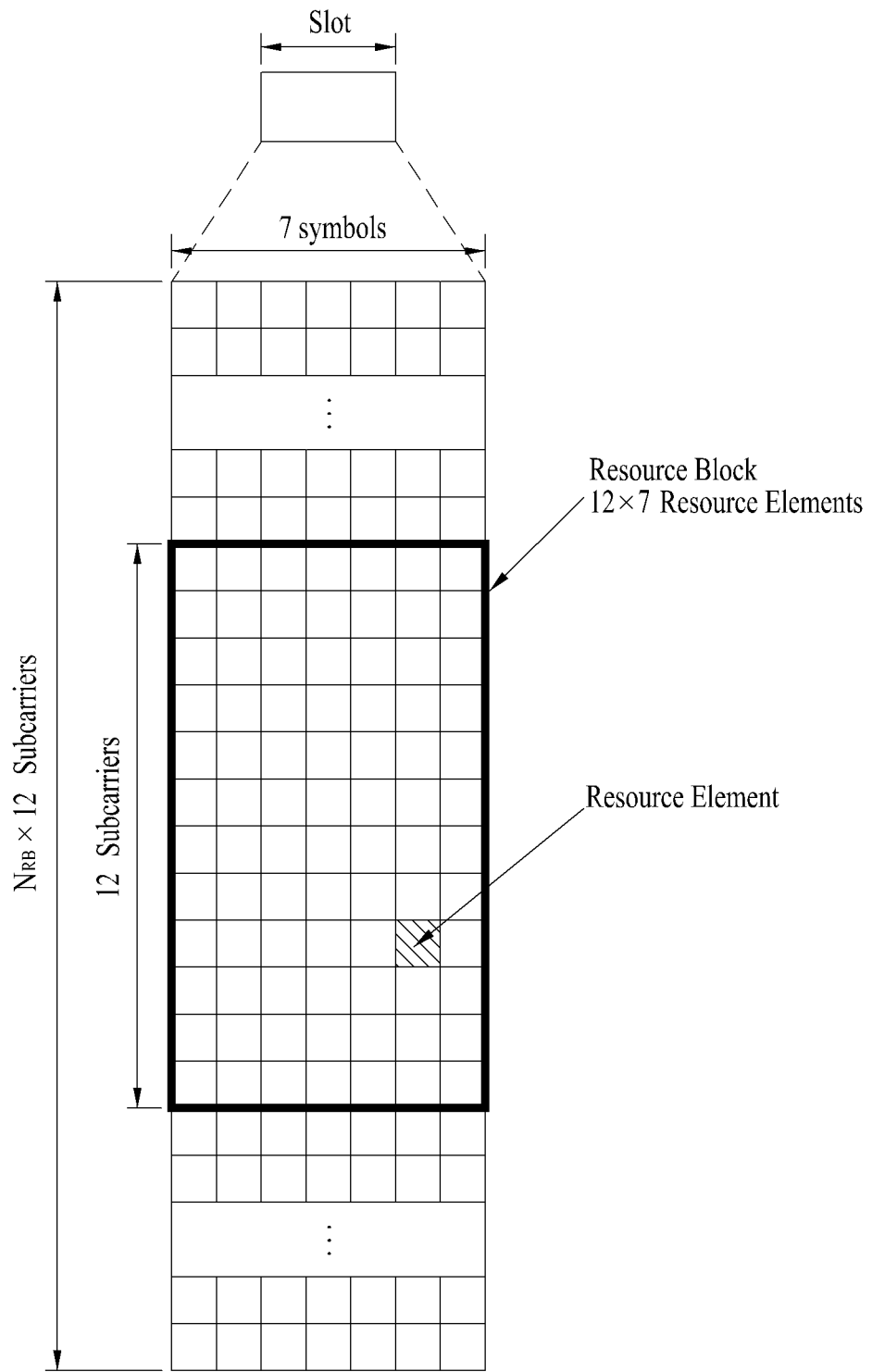
FIG. 3 is a diagram illustrating an exemplary resource grid for the duration of a downlink slot.

FIG. 3 illustrates an exemplary structure of a DL resource grid for the duration of one DL slot, which may be used in embodiments of the present invention.

Referring to FIG. 3, a DL slot includes a plurality of OFDM symbols in the time domain. One DL slot includes 7 OFDM symbols in the time domain and an RB includes 12 subcarriers in the frequency domain, to which the present invention is not limited.

Each element of the resource grid is referred to as a Resource Element (RE). An RB includes 12×7 REs. The number of RBs in a DL slot, NDL depends on a DL transmission bandwidth. A UL slot may have the same structure as a DL slot.

Figure 4:
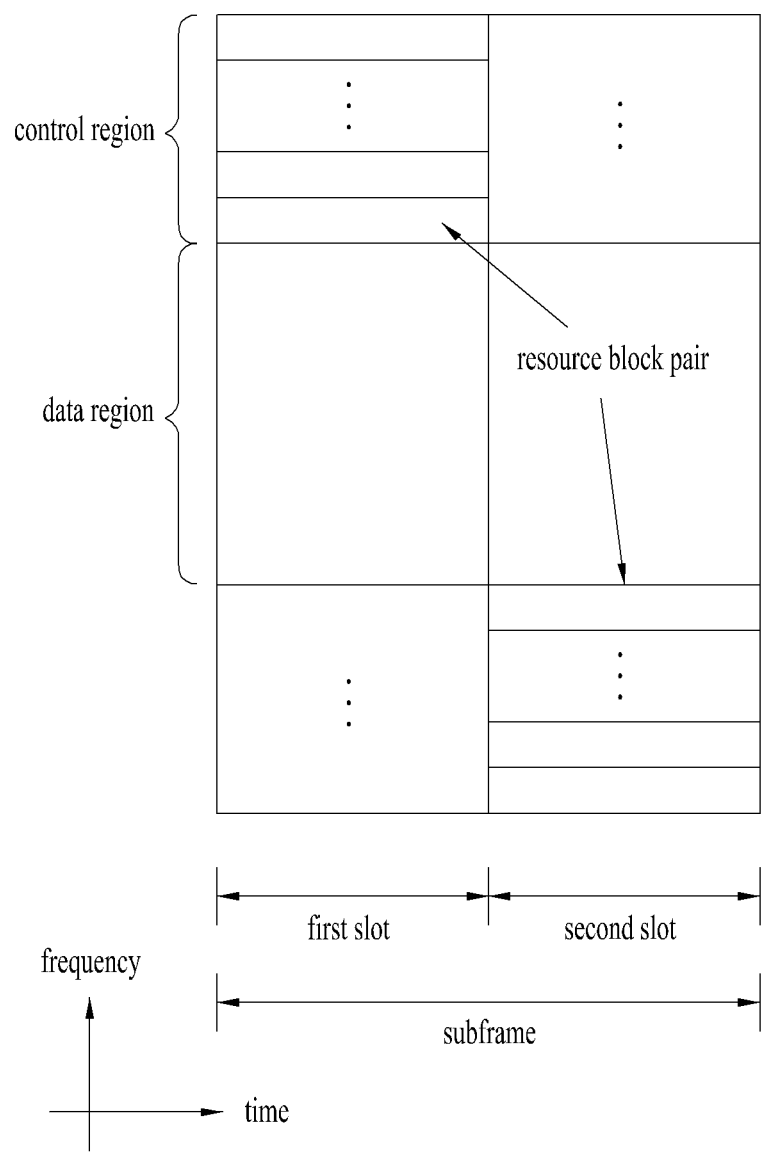
FIG. 4 is a diagram illustrating an exemplary structure of an uplink subframe.

FIG. 4 illustrates a structure of a UL subframe which may be used in embodiments of the present invention.

Referring to FIG. 4, a UL subframe may be divided into a control region and a data region in the frequency domain. A PUCCH carrying UCI is allocated to the control region and a PUSCH carrying user data is allocated to the data region. To maintain a single carrier property, a UE does not transmit a PUCCH and a PUSCH simultaneously. A pair of RBs in a subframe are allocated to a PUCCH for a UE. The RBs of the RB pair occupy different subcarriers in two slots. Thus it is said that the RB pair frequency-hops over a slot boundary.

Figure 5:
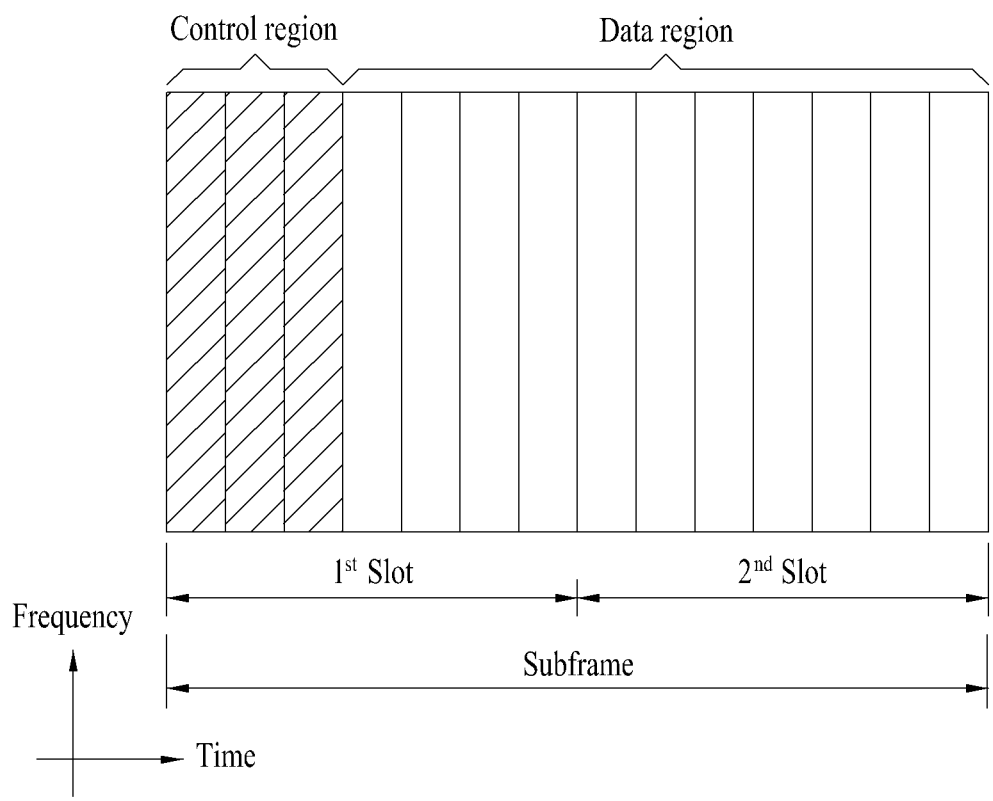
FIG. 5 is a diagram illustrating an exemplary structure of a downlink subframe.

FIG. 5 illustrates a structure of a DL subframe that may be used in embodiments of the present invention.

Referring to FIG. 5, up to three OFDM symbols of a DL subframe, starting from OFDM symbol 0 are used as a control region to which control channels are allocated and the other OFDM symbols of the DL subframe are used as a data region to which a PDSCH is allocated. DL control channels defined for the 3GPP LTE system include a Physical Control Format Indicator Channel (PCFICH), a PDCCH, and a Physical Hybrid ARQ Indicator Channel (PHICH).

The PCFICH is transmitted in the first OFDM symbol of a subframe, carrying information about the number of OFDM symbols used for transmission of control channels (i.e. the size of the control region) in the subframe. The PHICH is a response channel to a UL transmission, delivering an HARQ ACK/NACK signal. Control information carried on the PDCCH is called Downlink Control Information (DCI). The DCI transports UL resource assignment information, DL resource assignment information, or UL Transmission (Tx) power control commands for a UE group.

2. Carrier Aggregation (CA) Environment 2.1 CA Overview

A 3GPP LTE system (conforming to Rel-8 or Rel-9) (hereinafter, referred to as an LTE system) uses Multi-Carrier Modulation (MCM) in which a single Component Carrier (CC) is divided into a plurality of bands. In contrast, a 3GPP LTE-A system (hereinafter, referred to an LTE-A system) may use CA by aggregating one or more CCs to support a broader system bandwidth than the LTE system. The term CA is interchangeably used with carrier combining, multi-CC environment, or multi-carrier environment.

In the present invention, multi-carrier means CA (or carrier combining). Herein, CA covers aggregation of contiguous carriers and aggregation of non-contiguous carriers. The number of aggregated CCs may be different for a DL and a UL. If the number of DL CCs is equal to the number of UL CCs, this is called symmetric aggregation. If the number of DL CCs is different from the number of UL CCs, this is called asymmetric aggregation. The term CA is interchangeable with carrier combining, bandwidth aggregation, spectrum aggregation, etc.

The LTE-A system aims to support a bandwidth of up to 100 MHz by aggregating two or more CCs, that is, by CA. To guarantee backward compatibility with a legacy IMT system, each of one or more carriers, which has a smaller bandwidth than a target bandwidth, may be limited to a bandwidth used in the legacy system.

For example, the legacy 3GPP LTE system supports bandwidths {1.4, 3, 5, 10, 15, and 20 MHz} and the 3GPP LTE-A system may support a broader bandwidth than 20 MHz using these LTE bandwidths. A CA system of the present invention may support CA by defining a new bandwidth irrespective of the bandwidths used in the legacy system.

There are two types of CA, intra-band CA and inter-band CA. Intra-band CA means that a plurality of DL CCs and/or UL CCs are successive or adjacent in frequency. In other words, the carrier frequencies of the DL CCs and/or UL CCs are positioned in the same band. On the other hand, an environment where CCs are far away from each other in frequency may be called inter-band CA. In other words, the carrier frequencies of a plurality of DL CCs and/or UL CCs are positioned in different bands. In this case, a UE may use a plurality of Radio Frequency (RF) ends to conduct communication in a CA environment.

The LTE-A system adopts the concept of cell to manage radio resources. The above-described CA environment may be referred to as a multi-cell environment. A cell is defined as a pair of DL and UL CCs, although the UL resources are not mandatory. Accordingly, a cell may be configured with DL resources alone or DL and UL resources.

For example, if one serving cell is configured for a specific UE, the UE may have one DL CC and one UL CC. If two or more serving cells are configured for the UE, the UE may have as many DL CCs as the number of the serving cells and as many UL CCs as or fewer UL CCs than the number of the serving cells, or vice versa. That is, if a plurality of serving cells are configured for the UE, a CA environment using more UL CCs than DL CCs may also be supported.

CA may be regarded as aggregation of two or more cells having different carrier frequencies (center frequencies). Herein, the term 'cell' should be distinguished from 'cell' as a geographical area covered by an eNB. Hereinafter, intra-band CA is referred to as intra-band multi-cell and inter-band CA is referred to as inter-band multi-cell.

In the LTE-A system, a Primacy Cell (PCell) and a Secondary Cell (SCell) are defined. A PCell and an SCell may be used as serving cells. For a UE in RRC_CONNECTED state, if CA is not configured for the UE or the UE does not support CA, a single serving cell including only a PCell exists for the UE. On the contrary, if the UE is in RRC_CONNECTED state and CA is configured for the UE, one or more serving cells may exist for the UE, including a PCell and one or more SCells.

Serving cells (PCell and SCell) may be configured by an RRC parameter. A physical-layer ID of a cell, PhysCellId is an integer value ranging from 0 to 503. A short ID of an SCell, SCellIndex is an integer value ranging from 1 to 7. A short ID of a serving cell (PCell or SCell), ServeCellIndex is an integer value ranging from 1 to 7. If ServeCellIndex is 0, this indicates a PCell and the values of ServeCellIndex for SCells are pre-assigned. That is, the smallest cell ID (or cell index) of ServeCellIndex indicates a PCell.

A PCell refers to a cell operating in a primary frequency (or a primary CC). A UE may use a PCell for initial connection establishment or connection reestablishment. The PCell may be a cell indicated during handover. In addition, the PCell is a cell responsible for control-related communication among serving cells configured in a CA environment. That is, PUCCH allocation and transmission for the UE may take place only in the PCell. In addition, the UE may use only the PCell in acquiring system information or changing a monitoring procedure. An Evolved Universal Terrestrial Radio Access Network (E-UTRAN) may change only a PCell for a handover procedure by a higher-layer RRCConnectionReconfiguraiton message including mobilityControlInfo to a UE supporting CA.

An SCell may refer to a cell operating in a secondary frequency (or a secondary CC). Although only one PCell is allocated to a specific UE, one or more SCells may be allocated to the UE. An SCell may be configured after RRC connection establishment and may be used to provide additional radio resources. There is no PUCCH in cells other than a PCell, that is, in SCells among serving cells configured in the CA environment.

When the E-UTRAN adds an SCell to a UE supporting CA, the E-UTRAN may transmit all system information related to operations of related cells in RRC_CONNECTED state to the UE by dedicated signaling. Changing system information may be controlled by releasing and adding a related SCell. Herein, a higher-layer RRCConnectionReconfiguration message may be used. The E-UTRAN may transmit a dedicated signal having a different parameter for each cell rather than it broadcasts in a related SCell.

After an initial security activation procedure starts, the E-UTRAN may configure a network including one or more SCells by adding the SCells to a PCell initially configured during a connection establishment procedure. In the CA environment, each of a PCell and an SCell may operate as a CC. Hereinbelow, a Primary CC (PCC) and a PCell may be used in the same meaning and a Secondary CC (SCC) and an SCell may be used in the same meaning in embodiments of the present invention.

2.2 Cross Carrier Scheduling

Two scheduling schemes, self-scheduling and cross carrier scheduling are defined for a CA system, from the perspective of carriers or serving cells. Cross carrier scheduling may be called cross CC scheduling or cross cell scheduling.

In self-scheduling, a PDCCH (carrying a DL grant) and a PDSCH are transmitted in the same DL CC or a PUSCH is transmitted in a UL CC linked to a DL CC in which a PDCCH (carrying a UL grant) is received.

In cross carrier scheduling, a PDCCH (carrying a DL grant) and a PDSCH are transmitted in different DL CCs or a PUSCH is transmitted in a UL CC other than a UL CC linked to a DL CC in which a PDCCH (carrying a UL grant) is received.

Cross carrier scheduling may be activated or deactivated UE-specifically and indicated to each UE semi-statically by higher-layer signaling (e.g. RRC signaling).

If cross carrier scheduling is activated, a Carrier Indicator Field (CIF) is required in a PDCCH to indicate a DL/UL CC in which a PDSCH/PUSCH indicated by the PDCCH is to be transmitted. For example, the PDCCH may allocate PDSCH resources or PUSCH resources to one of a plurality of CCs by the CIF. That is, when a PDCCH of a DL CC allocates PDSCH or PUSCH resources to one of aggregated DL/UL CCs, a CIF is set in the PDCCH. In this case, the DCI formats of LTE Release-8 may be extended according to the CIF. The CIF may be fixed to three bits and the position of the CIF may be fixed irrespective of a DCI format size. In addition, the LTE Release-8 PDCCH structure (the same coding and resource mapping based on the same CCEs) may be reused.

On the other hand, if a PDCCH transmitted in a DL CC allocates PDSCH resources of the same DL CC or allocates PUSCH resources in a single UL CC linked to the DL CC, a CIF is not set in the PDCCH. In this case, the LTE Release-8 PDCCH structure (the same coding and resource mapping based on the same CCEs) may be used.

If cross carrier scheduling is available, a UE needs to monitor a plurality of PDCCHs for DCI in the control region of a monitoring CC according to the transmission mode and/or bandwidth of each CC. Accordingly, an appropriate SS configuration and PDCCH monitoring are needed for the purpose.

In the CA system, a UE DL CC set is a set of DL CCs scheduled for a UE to receive a PDSCH, and a UE UL CC set is a set of UL CCs scheduled for a UE to transmit a PUSCH. A PDCCH monitoring set is a set of one or more DL CCs in which a PDCCH is monitored. The PDCCH monitoring set may be identical to the UE DL CC set or may be a subset of the UE DL CC set. The PDCCH monitoring set may include at least one of the DL CCs of the UE DL CC set. Or the PDCCH monitoring set may be defined irrespective of the UE DL CC set. DL CCs included in the PDCCH monitoring set may be configured to always enable self-scheduling for UL CCs linked to the DL CCs. The UE DL CC set, the UE UL CC set, and the PDCCH monitoring set may be configured UE-specifically, UE group-specifically, or cell-specifically.

If cross carrier scheduling is deactivated, this implies that the PDCCH monitoring set is always identical to the UE DL CC set. In this case, there is no need for signaling the PDCCH monitoring set. However, if cross carrier scheduling is activated, the PDCCH monitoring set is preferably defined within the UE DL CC set. That is, the eNB transmits a PDCCH only in the PDCCH monitoring set to schedule a PDSCH or PUSCH for the UE.

Figure 6:
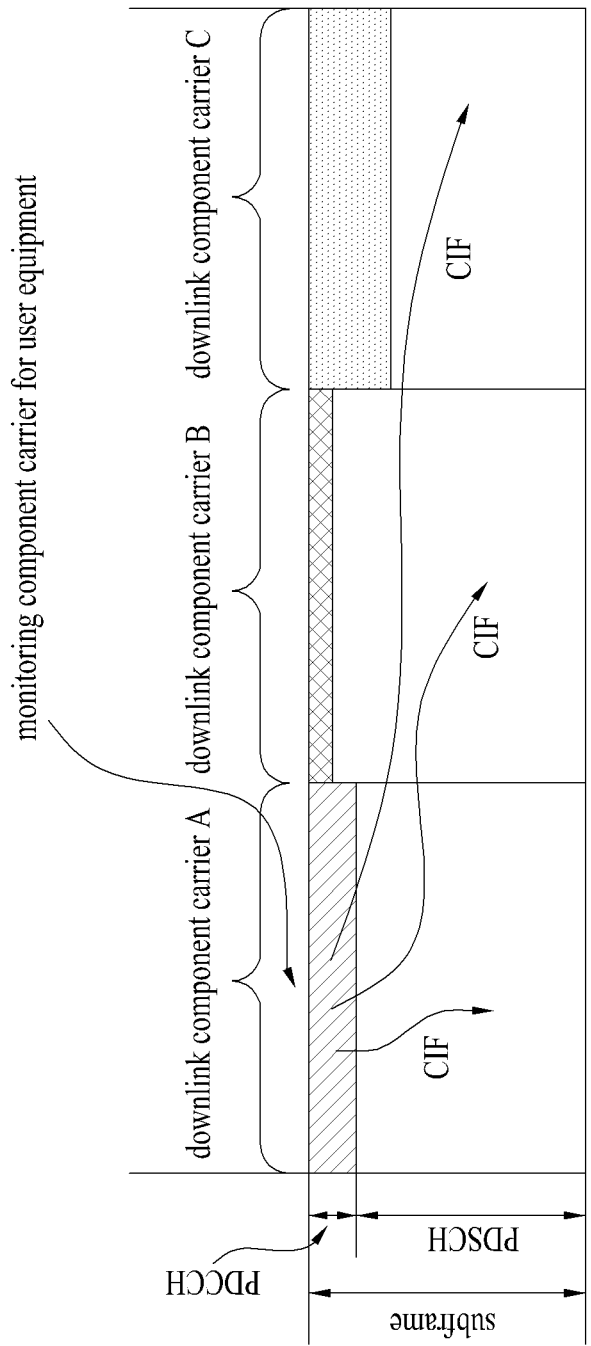
FIG. 6 illustrates a cross carrier-scheduled subframe structure in the LTE-A system, which is used in embodiments of the present invention.

FIG. 6 illustrates a cross carrier-scheduled subframe structure in the LTE-A system, which is used in embodiments of the present invention.

Referring to FIG. 6, three DL CCs are aggregated for a DL subframe for LTE-A UEs. DL CC 'A' is configured as a PDCCH monitoring DL CC. If a CIF is not used, each DL CC may deliver a PDCCH that schedules a PDSCH in the same DL CC without a CIF. On the other hand, if the CIF is used by higher-layer signaling, only DL CC 'A' may carry a PDCCH that schedules a PDSCH in the same DL CC 'A' or another CC. Herein, no PDCCH is transmitted in DL CC 'B' and DL CC 'C' that are not configured as PDCCH monitoring DL CCs.

3. Common Control Channel and Broadcast Channel Allocation Method 3.1 Initial Access Procedure An initial access procedure may include a cell discovery procedure, a system information acquisition procedure and a random access procedure.

Figure 7:
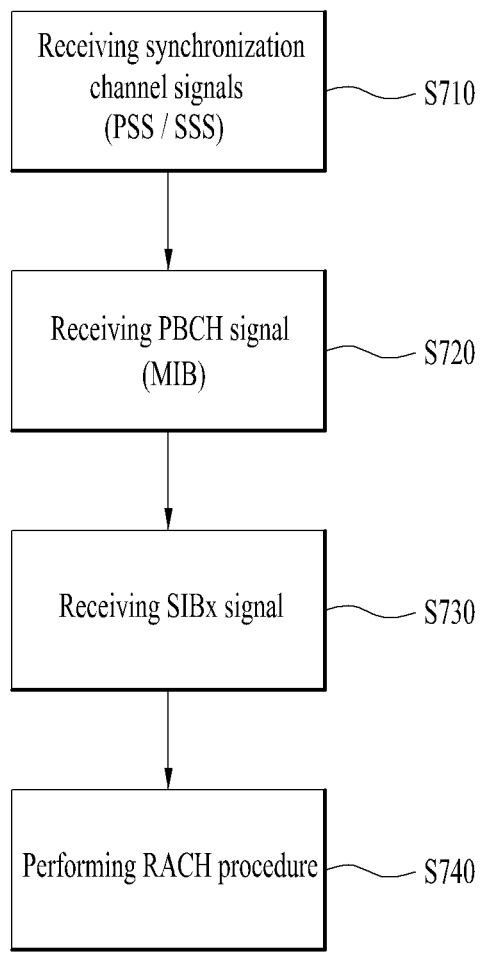
FIG. 7 is a diagram showing an example of an initial access procedure used in an LTE/LTE-A system.

FIG. 7 is a diagram showing an example of an initial access procedure used in an LTE/LTE-A system.

A UE may receive synchronization signals (e.g., a primary synchronization signal (PSS) and a secondary synchronization signal (SSS)) transmitted from an eNB to acquire downlink synchronization information. The synchronization signals are transmitted twice per frame (at an interval of 10 ms). That is, the synchronization signals are transmitted at an interval of 5 ms (S710).

The downlink synchronization information acquired in step S710 may include a physical cell ID (PCID), downlink time and frequency synchronization and cyclic prefix (CP) length information.

Thereafter, the UE receives a physical broadcast channel (PBCH) signal transmitted via a PBCH. At this time, the PBCH signal is repeatedly transmitted four times in different scrambling sequences in four frames (that is, 40 ms) (S720).

The PBCH signal includes a master information block (MIB) as system information. One MIB has a total size of 24 bits and 14 bits thereof are used to indicate physical HARQ indicator channel (PHICH) configuration information, downlink cell bandwidth (dl-bandwidth) information and system frame number (SFN). The remaining 10 bits thereof are spare bits.

Thereafter, the UE may receive different system information blocks (SIBs) transmitted from the eNB to acquire the remaining system information. The SIBs are transmitted on a DL-SCH and presence/absence of the SIB is checked by a PDCCH signal masked with a system information radio network temporary identifier (SI-RNTI) (S730).

System information block type 1 (SIB1) of the SIBs includes parameters necessary to determine whether the cell is suitable for cell selection and information on scheduling of the other SIBs on a time axis. System information block type 2 (SIB2) includes common channel information and shared channel information. SIB3 to SIB8 include cell reselection related information, inter-frequency information, intra-frequency information, etc. SIB9 is used to deliver the name of a home eNodeB (HeNB) and SIB10 to SIB12 include an Earthquake and Tsunami Warning Service (ETWS) notification and a commercial mobile alert system (CMAS) message. SIB13 includes MBMS related control information.

The UE may perform the random access procedure when steps S710 to S730 are performed. In particular, the UE may acquire parameters for transmitting a physical random access channel (PRACH) signal upon receiving SIB2 of the above-described SIBs. Accordingly, the UE may generate and transmit a PRACH signal using the parameters included in SIB2 to perform the random access procedure with the eNB (S740).

3.2 Physical Broadcast Channel (PBCH)

In an LTE/LTE-A system, a PBCH is used for MIB transmission. Hereinafter, a method for configuring a PBCH will be described.

A block of bits $b(0), \ldots, b(M_{bit}-1)$ is scrambled with a cell-specific sequence prior to modulation to calculate a block of scrambled bits $\tilde{b}(0), \ldots, \tilde{b}(M_{bit}-1)$. At this time, $M_{bit}$ denotes the number of bits transmitted on the PBCH and is 1920 bits for normal cyclic prefix and 1728 bits for extended cyclic prefix.

Equation 1 below shows one of methods for scrambling the block of bits.

$$\tilde{b}(1)=(b(i)+c(i)) \bmod 2 \qquad \text{[Equation 1]}$$

In Equation 1, c(i) denotes a scrambling sequence. The scrambling sequence is cell initialized with $c_{init}=N_{ID}^{cell}$ in each radio frame fulfilling $n_f \bmod 4=0$ The block of scrambled bits $\tilde{b}(0), \ldots, \tilde{b}(M_{bit}-1)$ is modulated to calculate a block of complex-valued modulation symbols $d(0), \ldots, d(M_{symb}-1)$. At this time, a modulation scheme applicable to a physical broadcast channel is quadrature phase shift keying (QPSK).

The block of modulation symbols $d(0), \ldots, d(M_{symb}-1)$ is mapped to one or more layers. At this time, $M_{symb}^{(0)}=M_{symb}$. Thereafter, the block of modulation symbols is precoded to calculate a block of vectors $y(i)=[y^{(0)}(i) \ldots y^{(P-1)}(i)]^T$. Here, $i=0, \ldots, M_{symb}-1$. In addition, $y^{(p)}(i)$ denotes a signal for an antenna port p, where $p=0, \ldots, P-1$ and $P \in \{1,2,4\}$. p denotes the number of an antenna port for a cell-specific reference signal.

The block of complex-valued symbols $y^{(p)}(0), \ldots, y^{(p)}(M_{symb}-1)$ for each antenna port is transmitted during 4 consecutive radio frames starting in each radio frame fulfilling $n_f \bmod 4=0$. In addition, the block of complex-valued symbols is mapped to resource elements (k, l) not reserved for transmission of reference signals in increasing order of first the index k, then the index l of slot 1 of subframe 0 and finally the radio frame number. The resource element indices are given in Equation 2.

$$k = \frac{N_{RB}^{DL}N_{sc}^{RB}}{2} - 36 + k', k' = 0, 1, \ldots, 71 \quad \text{[Equation 2]}$$

$$l = 0, 1, \ldots, 3$$

Resource elements for reference signals are excluded from mapping. The mapping operation assumes that cell-specific reference signals for antenna ports 0 to 3 are present irrespective of the actual configuration. The UE assumes that the resource elements assumed to be reserved for reference signals in the mapping operation but not used for transmission of reference signals are not available for PDSCH transmission. The UE does not make any other assumptions about these resource elements.

3.3 Master Information Block (MIB)

The MIB is system information transmitted on a PBCH. That is, the MIB includes system information transmitted via a BCH. A signaling radio bearer is not applicable to the MIB, a radio link control-service access point (RLC-SAP) is in a transparent mode (TM), a logical channel is a broadcast control channel (BCCH), and the MIB is transmitted from an E-UTRAN to a UE. Table 2 below shows an example of an MIB format.

TABLE 2

```
-- ASN1START
MasterInformationBlock ::= SEQUENCE {
    dl-Bandwidth           ENUMERATED {
                              n6, n15, n25, n50, n75, n100},
    phich-Config           PHICH-Config,
    systemFrameNumber      BITSTRING (SIZE (8)),
    spare                  BIT STRING (SIZE (10))
}
-- ASN1STOP
```

The MIB includes a downlink bandwidth (dl-Bandwidth) parameter, a PHICH configuration (PHICH-config) parameter, a system frame number (systemFrameNumber) parameter and spare bits.

The downlink bandwidth parameter indicates 16 different transmission bandwidth configurations $N_{RB}$. For example, n6 corresponds to 6 resource blocks and n15 corresponds to 15 resource blocks. The PHICH configuration parameter indicates a PHICH configuration necessary to receive a control signal on a PDCCH necessary to receive a DL-SCH. The system frame number (SFN) parameter defines 8 most significant bits (MSBs) of the SFN. At this time, 2 least significant bits (LSBs) of the SFN are indirectly acquired via decoding of the PBCH. For example, timing of 40 ms PBCH TTI indicates 2 LSBs. This will be described in detail with reference to FIG. 8.

Figure 8:
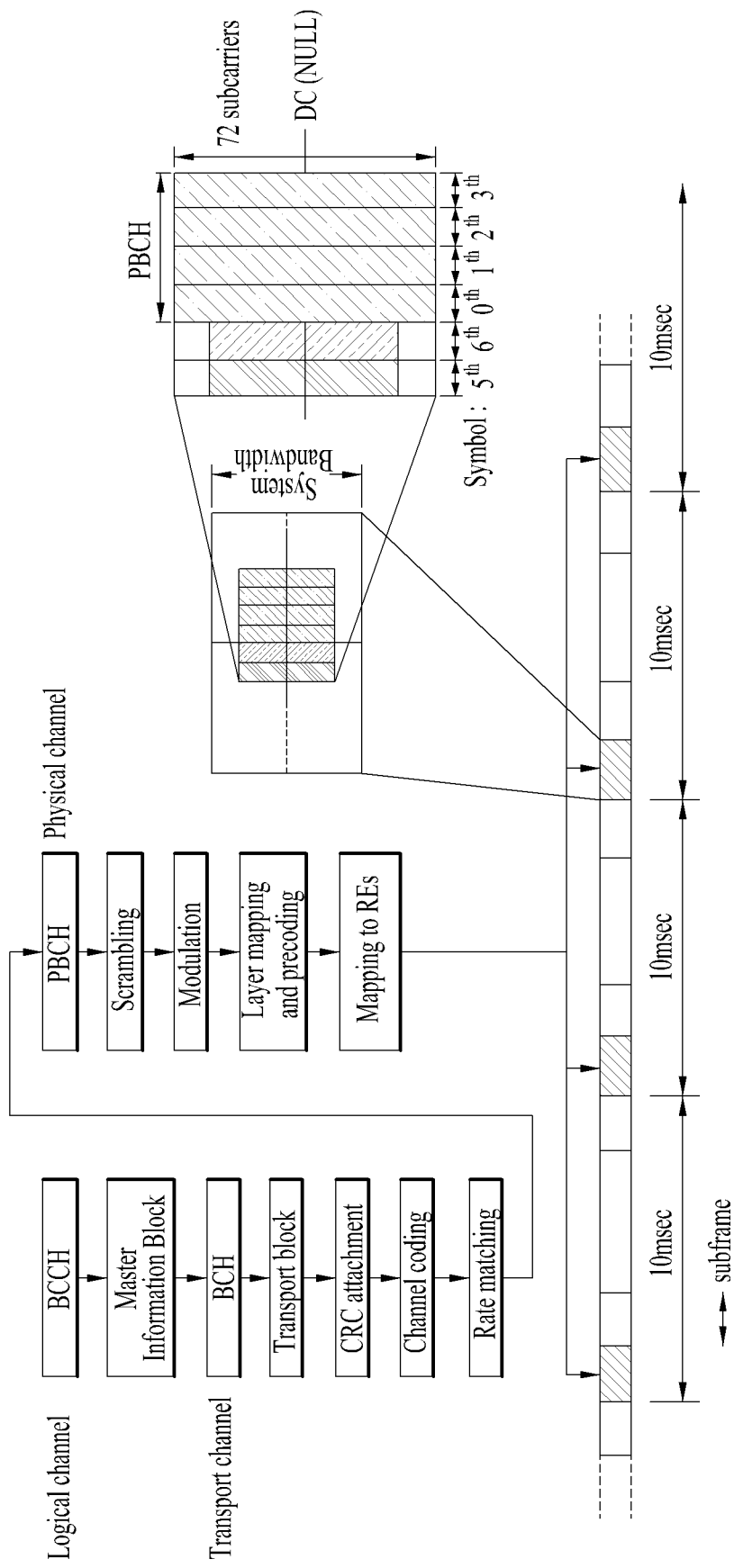
FIG. 8 is a diagram showing one method for transmitting a broadcast channel signal.

FIG. 8 is a diagram showing one method for transmitting a broadcast channel signal.

Referring to FIG. 8, an MIB transmitted via a BCCH, which is a logical channel, is delivered via a BCH which is a transport channel. At this time, the MIB is mapped to a transport block, and an MIB transport block is attached with CRC, is subjected to a channel coding and rate matching procedure and is delivered to a PBCH which is a physical channel. Thereafter, the MIB is subjected to scrambling and modulation procedures and a layer mapping and precoding procedure and then is mapped to a resource element (RE). That is, the same PBCH signal is scrambled and transmitted in different scrambling sequences during a period of 40 ms (that is, four frames). Accordingly, the UE may detect one PBCH every 40 ms via blind decoding and estimate the remaining 2 bits of the SFN.

For example, in a PBCH TTI of 40 ms, the LSB of the SFN is set to "00" when a PBCH signal is transmitted on a first radio frame, is set to "01" when the PBCH signal is transmitted on a second radio frame, is set to "10" when the PBCH signal is transmitted on a third radio frame, and is a set to "11" when the PBCH signal is transmitted on a last radio frame.

In addition, referring to FIG. 8, the PBCH may be allocated to 72 subcarriers located at the center of the first four OFDM symbols of a second slot (slot #1) of a first subframe (subframe #0) of each frame. At this time, a subcarrier region, to which the PBCH is allocated, is always a region corresponding to 72 center subcarriers irrespective of cell bandwidth. This allows detection of a PBCH even when downlink cell bandwidth is not known to the UE.

In addition, a primary synchronization channel (PSC), in which a primary synchronization signal (PSS) is transmitted, has a TTI of 5 ms and is allocated to a last symbol of a first slot (slot #0) of subframes #0 and #5 of each frame. A secondary synchronization channel (SSC), on which a secondary synchronization signal (SSS) is transmitted, has a TTI of 5 ms and is allocated to the second to last symbol (that is, a previous symbol of the PSS) of the same slot. In addition, the PSC and the SSC always occupy 72 center subcarriers irrespective of cell bandwidth and are allocated to 62 subcarriers.

3.4 CA Environment-Based CoMP Operation

Hereinafter, a cooperative multi-point (CoMP) transmission operation applicable to embodiments of the present invention will be described.

In the LTE-A system, the CoMP transmission may be implemented using the carrier aggregation (CA) function of the LTE system. FIG. 9 is a conceptual diagram of a CoMP system operating based on a CA environment.

In FIG. 9, it is assumed that a carrier operating in a Pcell and a carrier operating in an Scell can use the same frequency band in the frequency domain and are allocated to two eNBs geographically separated from each other. In this case, the serving eNB of UE 1 may be allocated to the Pcell, and a neighboring cell applying a lot of interference may be allocated to the Scell. In other words, the Pcell eNB and the Scell eNB may perform various DL/UL CoMP operations such as joint transmission (JT), CS/CB, and dynamic cell selection with respect to one UE.

FIG. 9 illustrates an exemplary case where cells managed by two eNBs for one UE (e.g., UE1) are combined as a Pcell and a Scell. In another example, three or more cells may be combined. For example, some of the three or more cells may perform a CoMP operation for one UE in the same frequency band, and the other cells may perform a simple CA operation in another frequency band. In this case, the Pcell is not required to participate in the CoMP operation.

3.5 Reference Signal (RS)

Hereinafter, reference signals that can be used in embodiments of the present invention will be described.

Figure 10:
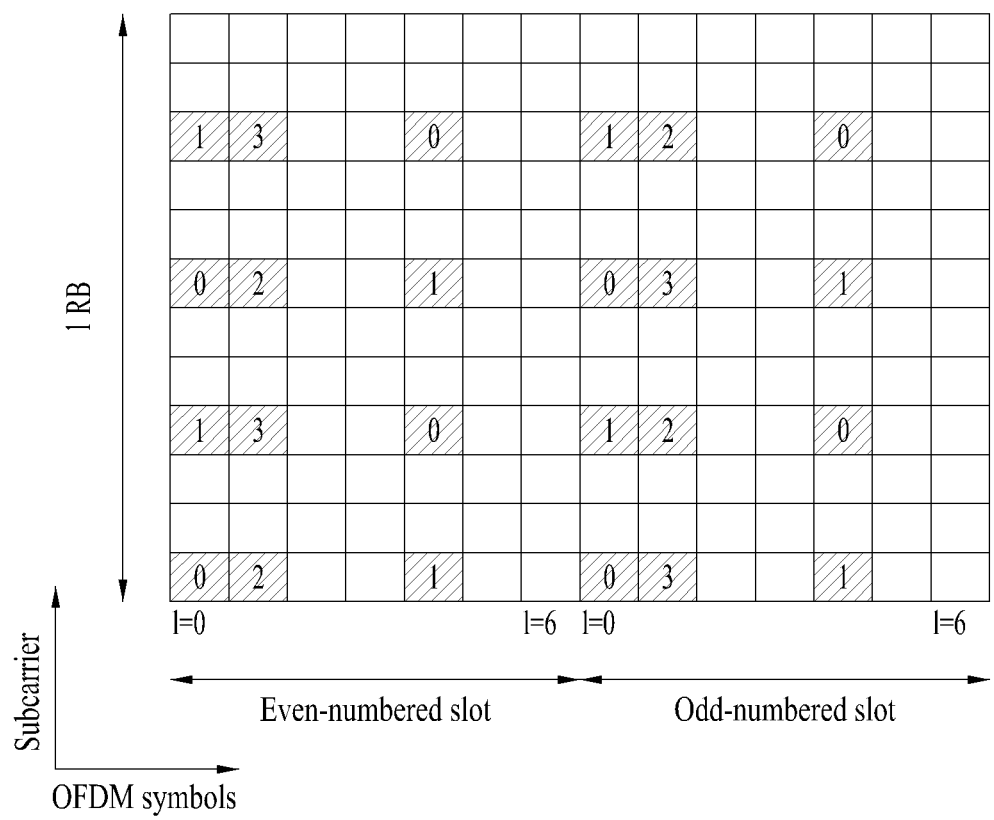
FIG. 10 is a diagram illustrating an example of a subframe that is allocated a cell specific reference signal (CRS), which can be used in embodiments of the present invention.

FIG. 10 is a diagram illustrating an example of a subframe that is allocated a cell specific reference signal (CRS), which can be used in embodiments of the present invention.

FIG. 10 shows a CRS allocation structure configured when the system supports four antennas. In the 3GPP LTE/LTE-A system, the CRS is used for the purposes of decoding and channel state measurement. Therefore, the CRS is transmitted over the entire downlink bandwidth in all downlink subframes in a cell supporting PDSCH transmission, and is transmitted through all antenna ports configured in an eNB.

Specifically, a CRS sequence is mapped to complex-valued modulation symbols, which are used as reference symbols for antenna port p in slot $n_s$.

A UE may measure CSI using the CRS, and decode a downlink data signal received on the PDSCH in a subframe including the CRS, using the CRS. That is, the eNB transmits a CRS at a certain position in each of all RBs, and the UE detects the PDSCH after performing channel estimation based on the CRS. For example, the UE measures a received signal at a CRS RE. The UE may detect a PDSCH signal from an RE to which the PDSCH is mapped, using the ratio of the reception energy per CRS RE to the reception energy per RE to which the PDSCH is mapped.

When the PDSCH signal is to be transmitted based on the CRS as described above, the eNB needs to transmit the CRS for all the RBs, and accordingly unnecessary RS overhead is generated. In order to address this issue, a UE-specific RS (hereinafter referred to as UE-RS) and a channel state information reference signal (CSI-RS) are defined along with the CRS in the 3GPP LTE-A system. The UE-RS is used for demodulation and the CSI-RS is used to derive channel state information.

The UE-RS and the CRS are used for demodulation and thus may be referred to as demodulation RSs in terms of application. That is, the UE-RS may be regarded as a demodulation reference signal (DM-RS). In addition, the CSI-RS and the CRS are used for channel measurement or channel estimation, and thus may be referred to as channel state measurement RSs in terms of application.

Figure 11:
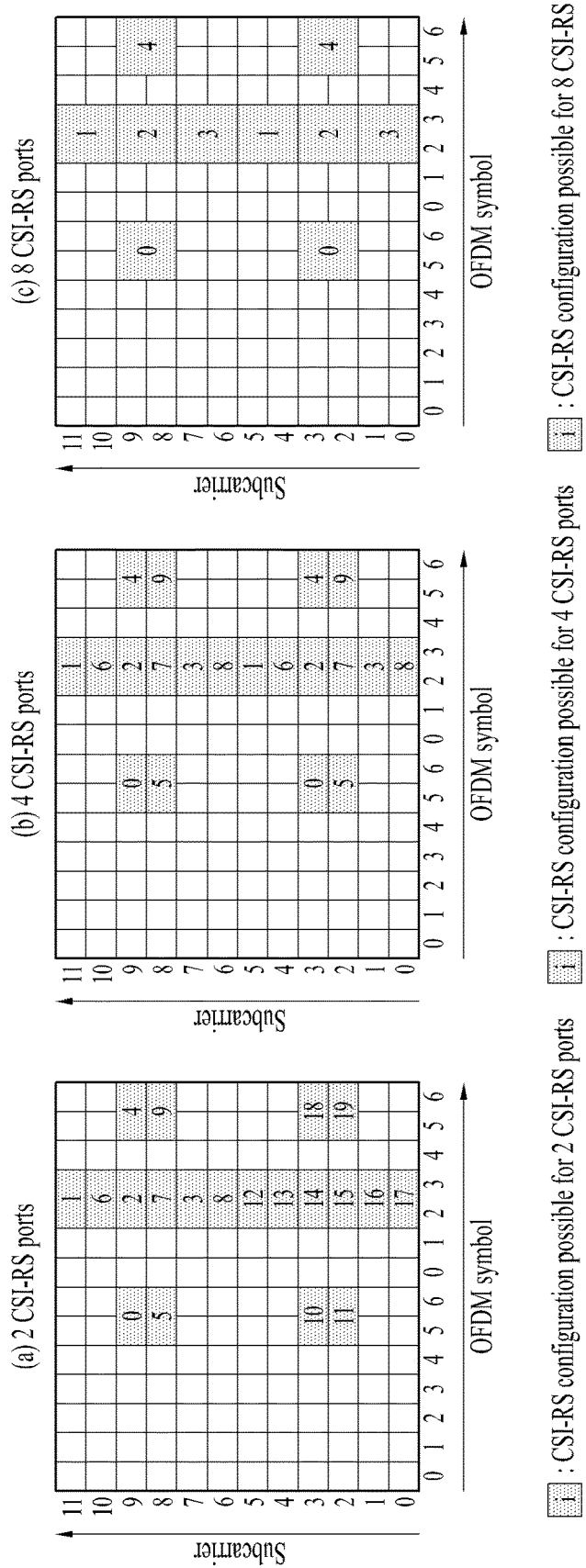
FIG. 11 is a diagram illustrating an example of subframes to which a CSI-RS usable in embodiments of the present invention are allocated according to the number of antenna ports.

FIG. 11 is a diagram illustrating an example of subframes to which a CSI-RS usable in embodiments of the present invention are allocated according to the number of antenna ports.

The CSI-RS is a downlink reference signal introduced in the 3GPP LTE-A system for the purpose of measuring the state of a radio channel, not for the purpose of demodulation. The 3GPP LTE-A system defines a plurality of CSI-RS configurations for CSI-RS transmission. In subframes in which CSI-RS transmission is configured, the CSI-RS sequence is mapped according to complex modulation symbols used as reference symbols on antenna port p.

FIG. 11(a) shows 20 CSI-RS configurations 0 to 19 available for transmission of the CSI-RS through two CSI-RS ports among the CSI-RS configurations, FIG. 11(b) shows 10 CSI-RS configurations 0 to 9 available to 4 CSI-RS ports among the CSI-RS configurations, and FIG. 11(c) shows 5 CSI-RS configurations 0 to 4 available to 8 CSI-RS ports among the CSI-RS configurations.

Here, the CSI-RS port refers to an antenna port configured for CSI-RS transmission. The CSI-RS configuration depends on the number of CSI-RS ports. Therefore, even if the same CSI-RS configuration number is given, CSI-RS configurations are different from each other if the numbers of antenna ports configured for CSI-RS transmission therefor are not equal to each other.

Unlike the CRS, which is configured to be transmitted in every subframe, the CSI-RS is configured to be transmitted with a predetermined transmission periodicity corresponding to multiple subframes. Accordingly, the CSI-RS configuration depends not only on the location of the REs occupied by the CSI-RS within a RB pair but also on the subframes in which the CSI-RS is configured.

Further, when the same CSI-RS configuration number is given, the CSI-RS configurations are different from each other if the CSI-RS transmission subframes therefor are different from each other. For example, if different CSI-RS transmission periodicities ($T_{CSI-RS}$) are given or CSI-RS transmission is configured in different start subframes ($\Delta_{CSI-RS}$) in one radio frame, the CSI-RS configurations therefor may be considered to be different from each other.

Hereinafter, to distinguish between (1) a CSI-RS configuration that is assigned a CSI-RS configuration number and (2) a CSI-RS configuration varying depending on a CSI-RS configuration number, the number of CSI-RS ports, and/or a subframe in which the CSI-RS is configured, the configuration of the latter case (2) is referred to as a CSI-RS resource configuration. The configuration of the former case (1) is referred to as a CSI-RS configuration or a CSI-RS pattern.

When the eNB informs the UE of a CSI-RS resource configuration, it may provide information on the number of antenna ports used for transmission of CSI-RSs, a CSI-RS pattern, a CSI-RS subframe configuration $I_{CSI-RS}$, a UE assumption on reference PDSCH transmitted power for CSI feedback $P_c$, a zero power CSI-RS configuration list, a zero power CSI-RS subframe configuration, and the like.

The CSI-RS subframe configuration index $I_{CSI-RS}$ is information for specifying a subframe configuration periodicity $T_{CSI-RS}$ and a subframe offset $\Delta_{CSI-RS}$ for occurrence of CSI-RSs. Table 3 below illustrates the CSI-RS subframe configuration index $I_{CSI-RS}$ according to $T_{CSI-RS}$ and $\Delta_{CSI-RS}$.

TABLE 3

| CSI-RS-SubframeConfig $I_{CSI-RS}$ | CSI-RS periodicity $T_{CSI-RS}$ (subframes) | CSI-RS subframe offset $\Delta_{CSI-RS}$ (subframes) |
|---|---|---|
| 0-4 | 5 | $I_{CSI-RS}$ |
| 5-14 | 10 | $I_{CSI-RS}$ - 5 |
| 15-34 | 20 | $I_{CSI-RS}$ - 15 |
| 35-74 | 40 | $I_{CSI-RS}$ - 35 |
| 75-154 | 80 | $I_{CSI-RS}$ - 75 |

Here, the subframes satisfying Equation 3 below become subframes including the CSI-RS.

$$(10n_f + \lfloor n_s/2 \rfloor - \Delta_{CSI-RS}) \bmod T_{CSI-RS} = 0 \quad \text{[Equation 3]}$$

A UE configured in a transmission mode defined after the 3GPP LTE-A system (e.g., transmission mode 9 or another newly defined transmission mode) may perform channel measurement using the CSI-RS and decode the PDSCH using the UE-RS.

A UE configured in a transmission mode defined after the 3GPP LTE-A system (e.g., transmission mode 9 or another newly defined transmission mode) may perform channel measurement using the CSI-RS and decode the PDSCH using the UE-RS.

3.6 Enhanced PDCCH (EPDCCH)

In the 3GPP LTE/LTE-A system, when a cross carrier scheduling (CCS) operation in a aggregated state for a plurality of component carriers (CCs) (=(serving) cells) is defined, one scheduled CC may be preconfigured so as to receive DL/UL scheduling only from another scheduling CC (i.e., to receive a DL/UL grant PDCCH for the scheduled CC). Here, the scheduling CC is basically capable of performing DL/UL scheduling thereon. In other words, a search space (SS) for the PDCCH that schedules the scheduling/scheduled CCs in the CCS relationship may be present in the control channel region of all scheduling CCs.

In the LTE system, the FDD DL carrier or TDD DL subframes are configured such that the first n (n<=4) OFDM symbols of each subframe are used for transmission of PDCCH, PHICH and PCFICH, which are physical channels for transmission of various kinds of control information, and the other OFDM symbols are used for PDSCH transmission.

Here, the number of OFDM symbols used for control channel transmission in each subframe may be transmitted to the UE either dynamically on a physical channel such as PCFICH or semi-statically through RRC signaling.

Figure 12:
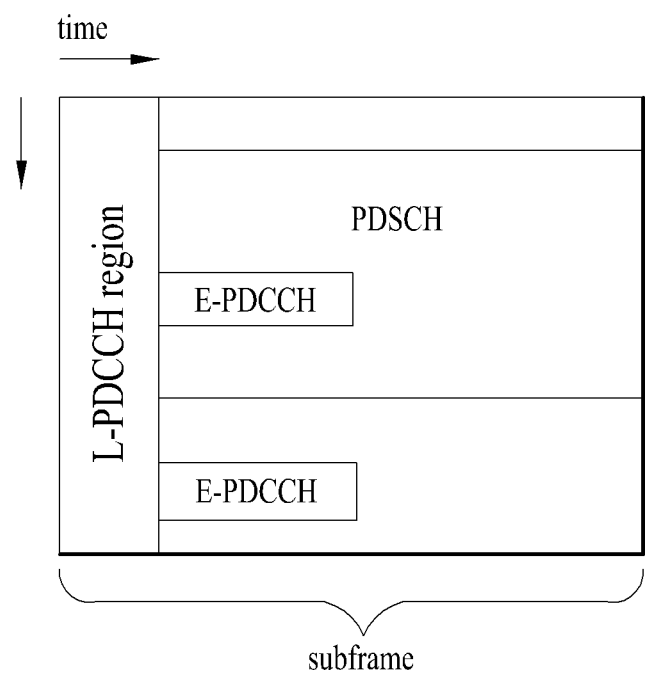
FIG. 12 is a diagram illustrating an example of multiplexing of the legacy PDCCH, a PDSCH, and an E-PDCCH used in an LTE/LTE-A system.

In the LTE/LTE-A system, the PDCCH, which is a physical channel for transmitting DL/UL scheduling and various kinds control information, has a limitation such as being transmitted through limited OFDM symbols. Therefore, an extended PDCCH (i.e. E-PDCCH) that can be more freely multiplexed with the PDSCH in an FDM/TDM manner, rather than with a control channels such as the PDCCH that is transmitted on OFDM symbols separated from the PDSCH may be introduced. FIG. 12 is a diagram illustrating an example of multiplexing of the legacy PDCCH, a PDSCH, and an E-PDCCH used in an LTE/LTE-A system.

PBCH Transmission in LTE System

The payload of the PBCH consists of a downlink system bandwidth, PHICH configuration information, and system frame number (SFN) information, and the ⅓ tail-biting convolutional coding for transmission is performed by adding CRC to the payload. The PBCH is transmitted in four radio frame units (40 ms). That is, the PBCH is transmitted on four OFDM symbols of the second slot of subframe #0 of radio frame #0. The bits of the encoded PBCH transmitted at each PBCH transmission time are 480 bits, and thus a total of 1920 encoded bits may be transmitted four times. For simplicity, it is assumed that the 1920-bit PBCH encoded bits are configured by concatenating PBCH(0), PBCH(1), PBCH(2), and PBCH(3), each of which has the size of 480 bits. Here, PBCH(k mod 4) is PBCH encoded bits of 480 bits transmitted in radio frame #k.

Polar Code

The input of a polar encoder is divided into a bit channel to which information data is mapped and a bit channel to which the information data is not mapped. According to the polar code theory, an input bit channel can be divided into a noise free channel and a noise channel as the codeword of a polar code extends to infinity. Therefore, a channel capacity may be obtained by assigning information to the noise free bit channel. However, since codewords of infinite length cannot be configured in reality, reliabilities of input bit channels are calculated and the data bits are allocated in order thereof. In this case, a bit channel to which data bits are allocated is referred to as a "good bit channel" in the present invention. Thus, a good bit channel may correspond to an input bit channel to which data bits are mapped. A bit channel to which no data is mapped is called a frozen bit channel. Generally, in encoding, the frozen bit channel is set to 0 (or any value is possible as long as it is known to the transmitting/receiving ends).

In performing puncturing or repetition is performed, information on the good bit channel obtained in polar encoding may be used. That is, a codeword bit position corresponding to an input bit position that is not allocated to an information bit may be punctured.

Polar code is known as a code by which a channel capacity can be obtained on a binary-input discrete memoryless channel (B-DMC). That is, the polar code is a code that can obtain a channel capacity when the size N of a code block (CB) increases to infinity. An polar code encoder is configured to perform two operations: channel combining and channel splitting.

Figure 13:
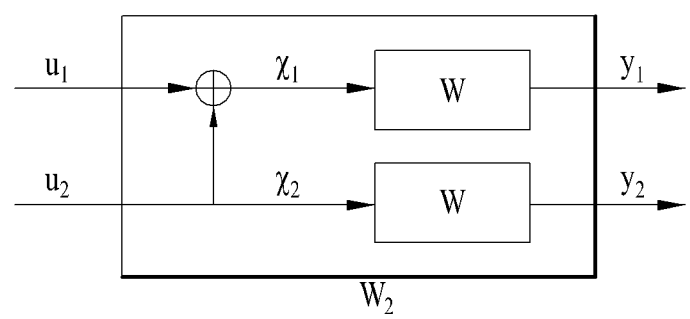
FIG. 13 is a diagram illustrating first-level channel combining for polar coding.

FIG. 13 is a diagram illustrating first-level channel combining for polar coding.

Channel combining is an operation of concatenating B-DMC channels in parallel, which the size of a code block is determined. In the example of FIG. 13, two channels of B-DMC channel and W are combined. Here, $u_1$ and $u_2$ are binary-input source bits, and $y_1$ and $y_2$ are output coded bits. In this case, it is assumed that the equivalent channel is $W_2$. When N B-DMC channels are combined, each channel may be represented in a recursive form. That is, $x_1^N = u_1^N G_N$, where $x_1^N = \{x_1, \ldots, x_N\}$, $u_1^N = \{u_1, \ldots, u_N\}$, and $G_N$ is a generator matrix. which may be expressed Equation 4 below.

$$G_N = B_N F^{\otimes n}, N = 2^n, F = \begin{bmatrix} 1 & 0 \\ 1 & 1 \end{bmatrix}, \quad \text{[Equation 4]}$$

$$F^{\otimes n} = F \otimes F^{\otimes (n-1)}, F^{\otimes 0} = 1, B_N = R_N\left(I_2 \otimes B_{\frac{N}{2}}\right)$$

Figure 14:
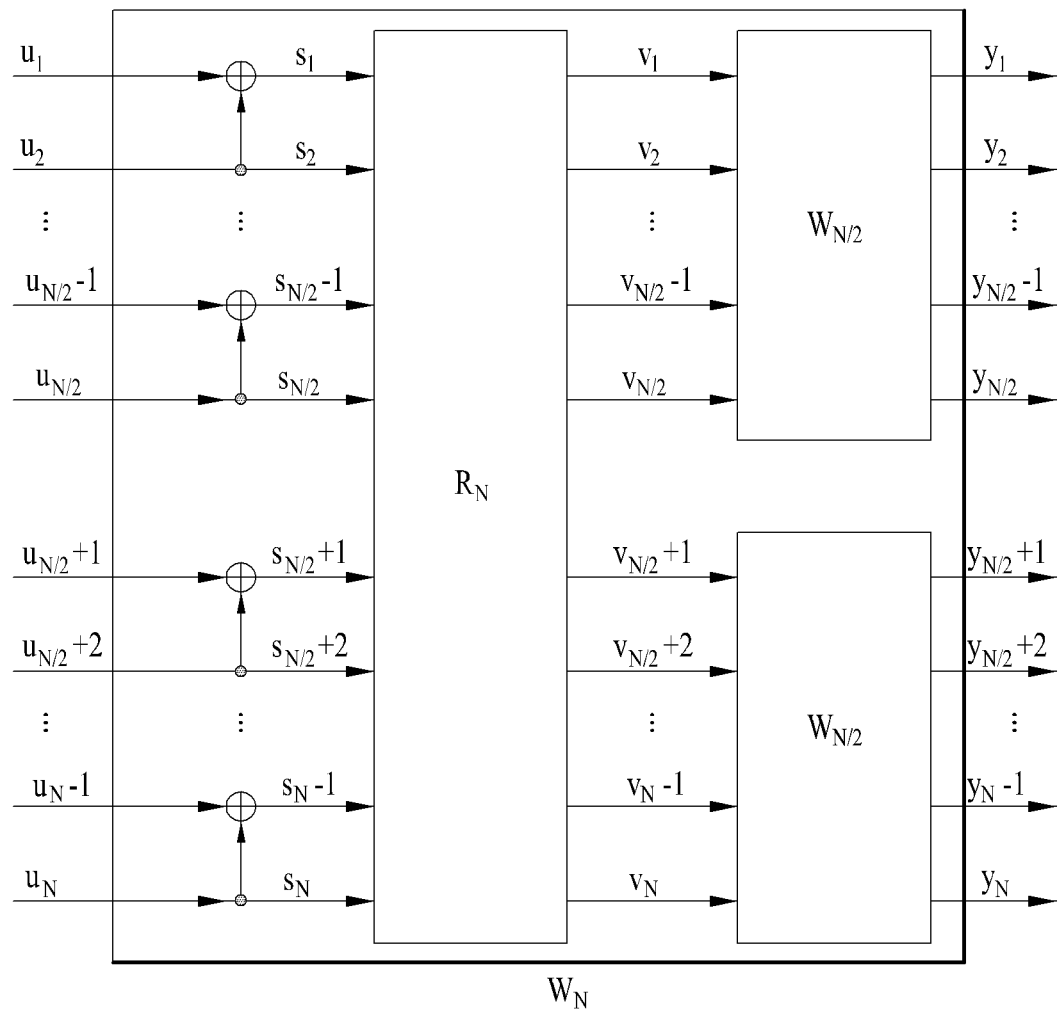
FIG. 14 is a diagram illustrating N-th level channel combining for a polar code.

In Equation 4, RN denotes a bit-reversal interleaver and maps input $s_1^N$ so as to obtain output $x_1^N = (s_1, s_3, \ldots, s_{N-1}, s_2, \ldots, s_N)$. The bit-reversal interleaver may not be included in the transmitting end. Such relationship is shown in FIG. 14. N, which denotes a code block size, is limited to take the form of $2^n$ (where n is a natural number).

FIG. 14 is a diagram illustrating N-th level channel combining for a polar code.

The operation of defining an equivalent channel for a specific input after combining N B-DMC channels is called channel splitting. This may be expressed as a channel transition probability as given by Equation 5 below.

$$W_N^{(i)}(y_1^N, u_1^{i-1} | u_i) = \sum_{u_{i+1}^N} \frac{1}{2^{N-1}} W_N(y_1^N | u_1^N) \quad \text{[Equation 5]}$$

Once channel combining and channel splitting are performed, theorem shown in Table 4 may be obtained.

TABLE 4

Theorem: For any B-DMC W, the channels $\{W_N^{(i)}\}$ polarize in the sense that, for any fixed $\delta \in (0,1)$, as N goes to infinity through powers of two, the fraction of indices $i \in \{1, \ldots, N\}$ for which $I(W_N^{(i)}) \in \{1 - \delta, 1]$ goes
to I(W) and the fraction for which $I(W_N^{(i)}) \in [0, \delta)$ goes to 1-I(W).
Hence, as N → ∞, channels polarize, either completely noisy or noise free and we know these channels exactly at the transmitter. So, we fix bad channels and transmit uncoded bits over good ones In other words, when the size N of the code block becomes infinite, the equivalent channel for a specific input bit is distinguished as a noisy channel or a noise free channel. This means that the capacity of the equivalent channel for the specific input bit is distinguished as 0 or I(W) (capacity of channel W).

Such a polar code decoding scheme is a successive cancellation (SC) decoding scheme. In the SC decoding scheme, the channel likelihood ratio (LLR) for the input bit is calculated by obtaining a channel transition probability. Here, the channel transition probability may be calculated in a recursive manner, based on the recursiveness of the channel combining operation and the channel splitting operation. Therefore, the LLR value may also be calculated in a recursive manner. First, for the input bit, $u_i$, the channel transition probability $W_N^{(i)}(y_1^N, u_1^{i-1}|u_i)$ may be obtained as follows. $u_1^i$ may be expressed as $u_{1,o}^i$ and $u_{1,e}^i$ by dividing the indexes into odd indexes and even indexes. In this case, the channel transition probability may be expressed by Equations 6 and 7.

$$W_{2N}^{(2i-1)}(y_1^{2N}, u_1^{2i-2} | u_{2i-1}) = \sum_{u_{2i}^{2N}} \frac{1}{2^{2N-1}} W_{2N}(y_1^{2N} | u_1^{2N}) =$$ [Equation 6]

$$\sum_{u_{2i,o}^{2N}, u_{2i,e}^{2N}} \frac{1}{2^{2N-1}} W_N(y_1^N | u_{1,o}^{2N} \oplus u_{1,e}^{2N}) W_N(y_{N+1}^{2N} | u_{1,e}^{2N}) =$$

$$\sum_{u_{2i}} \frac{1}{2} \sum_{u_{2i+1,e}^{2N}} \frac{1}{2^{N-1}} W_N(y_{N+1}^{2N} | u_{1,e}^{2N}) \cdot$$

$$\sum_{u_{2i+1,o}^{2N}} \frac{1}{2^{N-1}} W_N(y_1^N | u_{1,o}^{2N} \oplus u_{1,e}^{2N}) =$$

$$\sum_{u_{2i}} \frac{1}{2} W_N^{(i)}(y_1^N, u_{1,o}^{2i-2} \oplus u_{1,e}^{2i-2} | u_{2i-1} \oplus u_{2i}) \cdot$$

$$W_N^{(i)}(y_{N+1}^{2N}, u_{1,e}^{2i-2} | u_{2i})$$

using the definition of $$W_N^{(i)}(y_1^N, u_1^{i-1} | u_i) = \sum_{u_{i+1}^{2N}} \frac{1}{2^{N-1}} W_N(y_1^N | u_1^N)$$

$$W_{2N}^{(2i)}(y_1^{2N}, u_1^{2i-2} | u_{2i}) = \sum_{u_{2i+1}^{2N}} \frac{1}{2^{2N-1}} W_{2N}(y_1^{2N} | u_1^{2N}) =$$ [Equation 7]

$$\sum_{u_{2i,o}^{2N}, u_{2i+1,e}^{2N}} \frac{1}{2^{2N-1}} W_N(y_1^N | u_{1,o}^{2N} \oplus u_{1,e}^{2N}) W_N(y_{N+1}^{2N} | u_{1,e}^{2N}) =$$

$$\frac{1}{2} \sum_{u_{2i+1,e}^{2N}} \frac{1}{2^{N-1}} W_N(y_{N+1}^{2N} | u_{1,e}^{2N}) \cdot$$

$$\sum_{u_{2i+1,o}^{2N}} \frac{1}{2^{N-1}} W_N(y_1^N | u_{1,o}^{2N} \oplus u_{1,e}^{2N}) =$$

$$\frac{1}{2} W_N^{(i)}(y_1^N, u_{1,o}^{2i-2} \oplus u_{1,e}^{2i-2} | u_{2i-1} \oplus u_{2i}) \cdot$$

$$W_N^{(i)}(y_{N+1}^{2N}, u_{1,e}^{2i-2} | u_{2i})$$

Then, LLR, $$L_N^{(i)} = \frac{w_N^{(i)}(y_1^N, \hat{u}_1^{i-1} | 0)}{w_N^{(i)}(y_1^N, \hat{u}_1^{i-1} | 1)},$$

can be obtained as follows:

$$L_N^{(2i-1)}(y_1^N, \hat{u}_1^{2i-2}) = \frac{L_{N/2}^{(i)}(y_1^{N/2}, \hat{u}_{1,o}^{2i-2} \oplus \hat{u}_{1,e}^{2i-2}) L_{N/2}^{(i)}(y_{\frac{N}{2}+1}^N, \hat{u}_{1,e}^{2i-2}) + 1}{L_{N/2}^{(i)}(y_1^{N/2}, \hat{u}_{1,o}^{2i-2} \oplus \hat{u}_{1,e}^{2i-2}) + L_{N/2}^{(i)}(y_{\frac{N}{2}+1}^N, \hat{u}_{1,e}^{2i-2})}$$

$$L_N^{(2i)}(y_1^N, \hat{u}_1^{2i-2}) = [L_{N/2}^{(i)}(y_1^{N/2}, \hat{u}_{1,o}^{2i-2} \oplus \hat{u}_{1,e}^{2i-2})]^{1-2\hat{u}_{2i-1}} \cdot L_{N/2}^{(i)}(y_{\frac{N}{2}+1}^N, \hat{u}_{1,e}^{2i-2})$$

The complexity of the polar encoder and the SC decoder depends on the code block length N and is known to have complexity of O(N log N). Assuming K bits as input bits in the polar code of length N, the coding rate is N/K. In this case, when the generator matrix of a polar encoder of the data payload size N is $G_N$, the encoded bits may be expressed as $x_1^N = u_1^N G_N$. K bits of $u_1^N$ correspond to the payload bits. Suppose that the row index of $G_N$ corresponding to the payload bits is I, and the row index of $G_N$ corresponding to the remaining N−K bits is F. The minimum distance of such a polar code may be given as:

$$d_{min}(C) = \min_{i \in I} 2^{wt(i)},$$

wt(i): the number of ones in the binary expansion of i, i=0, 1, ..., N−1.

Table 5 below describes the initial access in the NR system.

TABLE 5

NR synchronization signal is based on CP-OFDM. NR defines at least two types of synchronization signals; NR-PSS and NR-SSS. NR-PSS is defined at least for initial symbol boundary synchronization to the NR cell. NR-SSS is defined for detection of NR cell ID or at least part of NR cell ID. The number of NR cell IDs is targeted to be approximately 1000. NR-SSS detection is based on the fixed time/frequency relationship with NR-PSS resource position irrespective of duplex mode and beam operation type at least within a given frequency range and CP overhead. At least, normal CP is supported for NR-PSS/SSS. The raster for NR synchronization signals can be different per frequency range. At least for frequency ranges where NR supports a wider carrier bandwidth and operation in a wider frequency spectrum (e.g. above 6 GHz), the NR synchronization signals raster can be larger than the 100 kHz raster of LTE. When the synchronization signal bandwidth is the same as the minimum system bandwidth for a given frequency band which UE searches, synchronization signal frequency raster is the same as the channel raster. For carrier supporting initial access, for frequency range up to 6 GHz, minimum carrier bandwidth for NR can be either 5 or 10 MHz and is frequency band dependent. For frequency range from 6 GHz to 52.6 GHz, minimum carrier bandwidth for 6 GHz to 52.6 GHz, minimum carrier bandwidth for NR can be either 40 or 80 MHz and is frequency band dependent.
At least one broadcast channel (NR-PBCH) is defined. NR-PBCH decoding is based on the fixed relationship with NR-PSS and/or NR-SSS resource position irrespective of duplex mode and beam operation type at least within a given frequency range and CP overhead. NR-PBCH is a non-scheduled broadcast channel carrying at least a part of minimum system information with fixed payload size and periodicity predefined in the specification depending on carrier frequency range.
In both single beam and multi-beam scenario, time division multiplexing of NR-PSS, NR-SSS, and NR-PBCH is supported. NR-PSS, NR-SSS and/or NR-PBCH can be transmitted within an SS block. For a given frequency band, an synchronization signal (SS) block corresponds to N OFDM symbols based on the default subcarrier spacing, and N is a constant. The signal multiplexing structure is fixed in a specification. UE shall be able to identify at least OFDM symbol index, slot index in a radio frame and radio frame number from an SS block.
One or multiple SS block(s) compose an SS burst. One or multiple SS burst(s) further compose an SS burst set where the number of SS bursts within a SS burst set is finite. From physical layer specification perspective, at least one periodicity of SS burst set is supported. From UE perspective, SS burst set transmission is periodic and UE may assume that a given SS block is repeated with a SS burst set periodicity. Note that NR-PBCH contents in a given repeated SS block may change. A single set of possible SS block time locations is specified per frequency band. The maximum number of SS-blocks within SS burst set may be carrier frequency dependent. The position(s) of actual transmitted SS-blocks can be informed for helping CONNECTED/IDLE mode measurement, for helping CONNECTED mode UE to receive DL data/control in unused SS-blocks and potentially for helping IDLE mode UE to receive DL data/control in unused SS-blocks. By default, the UE may neither assume the gNB transmits the same number of physical beam(s), nor the same physical beam(s) across different SS-blocks within an SS burst set. For initial cell selection, UE may assume default SS burst set periodicity which may be frequency band-dependent. At least for multi-beams case, at least the time index of SS-block is indicated to the UE.

Table 6 below shows the description of cell search (initial access) in the NR system.

TABLE 6

Cell search is the procedure by which a UE acquires time and frequency synchronization with a cell and detects the physical layer Cell ID of that cell.
A UE receives the following synchronization signals (SS) in order to perform cell search: the primary synchronization signal (PSS) and secondary synchronization signal (SSS) as defined in 3GPP TS 38.211 [3].
A UE shall assume that reception occasions of a physical broadcast channel (PBCH), PSS, and SSS coexist, as defined in 3GPP TS 38.211[3], and form a SS/PBCH block.

TABLE 6-continued

For carrier frequencies smaller than or equal to 3 GHz, a UE shall
assume a maximum of 4 SS/PBCH blocks per half frame. For carrier
frequencies larger than 3 GHz and smaller than or equal to 6 GHz,
the UE shall assume a maximum of 8 SS/PBCH blocks per half frame.
For carrier frequencies larger than 6 GHz, the UE shall assume a
maximum of 64 SS/PBCH blocks per half frame.
For a half frame and the first 14 OFDM symbols with 15 KHz subcarrier
spacing, or the first 28 OFDM symbols with 30 KHz sub-carrier spacing,
or the first 28 OFDM symbols with 120 KHz sub-carrier spacing, or the
first 56 OFDM symbols with 240 KHz sub-carrier spacing, the number
and first OFDM symbol indexes for candidate SS/PBCH blocks are as
follows.
15 KHz sub-carrier spacing: 2 candidate SS/PBCH blocks with
respective first OFDM symbol indexes of 2 and 8.
30 KHz sub-carrier spacing: 4 candidate SS/PBCH blocks with
respective first OFDM symbol indexes of 4, 8, 16, and 20.
30 KHz sub-carrier spacing: 4 candidate SS/PBCH blocks with
respective first OFDM symbol indexes of 2, 8, 16, and 22.
120 KHz sub-carrier spacing: 4 candidate SS/PBCH blocks with
respective first OFDM symbol indexes of 4, 8, 16, and 20.
240 KHz sub-carrier spacing: 8 candidate SS/PBCH blocks with
respective first OFDM symbol indexes of 8, 12, 16, 20, 33, 37, 41,
and 45.
For subcarrier spacing of 15 KHz and 4 SS/PBCH blocks per half frame,
2 SS/PBCH blocks are located in each of the first and second
consecutive and non-overlapping blocks of 14 OFDM symbols per half
frame.
For subcarrier spacing of 15 KHz and 8 SS/PBCH blocks per half frame,
2 SS/PBCH blocks are located in each of the first, second, third, and
fourth consecutive and non-overlapping blocks of 14 OFDM symbols
per half frame.
For subcarrier spacing of 30 KHz and 4 SS/PBCH blocks per half frame,
2 SS/PBCH blocks are located in each of the first and second
consecutive and non-overlapping blocks of 14 OFDM symbols per half
frame.
For subcarrier spacing of 30 KHz and 8 SS/PBCH blocks per half frame,
2 SS/PBCH blocks are located in each of the first, second, third, and
fourth consecutive and non-overlapping blocks of 14 OFDM symbols
per half frame.
For subcarrier spacing of 120 KHz and 64 SS/PBCH blocks per half
frame, 2 SS/PBCH blocks are located in each consecutive and non-
overlapping blocks of 14 OFDM symbols per half frame except for
the 5th, 10th, 15th, 20th, 25th, 30th, 35th, and 40th blocks.
For subcarrier spacing of 240 KHz and 64 SS/PBCH blocks per half
frame, 4 SS/PBCH blocks are located in each consecutive non-
overlapping blocks of 28 OFDM symbols in the first half of the half
frame except for the 5th, 10th, 15th, and 20th blocks.
SS/PBCH blocks in a half frame are indexed [in an ascending order
in time]. A UE shall determine the 3 [LSB] bits of a SS/PBCH block
index per half frame from the sequence of the DMRS transmitted in
the PBCH.
A UE can be configured [per serving cell] by higher layer parameter
blocks_period a periodicity of the half frames for receptions of
SS/PBCH blocks per serving cell. If the UE is not configured a
periodicity of the half frames for receptions of SS/PBCH blocks, the UE
shall assume a periodicity of half frame.
For initial cell search, a UE may assume that half frames with SS/PBCH
blocks occur with a periodicity of 2 frames When the UE performs initial access to a specific cell, the UE receives a master information block (MIB) for the corresponding cell on a physical broadcast channel (PBCH) and receives system information block (SIB) information and radio resource control (RRC) parameters on the PDSCH from an eNodeB operating/controlling the corresponding cell. The present invention proposes a method for performing transmission by performing PBCH encoding using a polar code.

Regarding the transmission scheme, it is assumed that 1920 bits are transmitted as encoded bits in 4 subframes as in the LTE system, and that the same data is transmitted in units of four subframes. The PBCH payload size is assumed to be 30 bits or 40 bits. For a payload size of 30 bits, the effective coding rate is 30/1920=1/64. For a payload size of 40 bits, the effective coding rate is 40/1920=1/64. For simplicity, a PBCH transmission scheme will be discussed on the assumption that the payload size is 30 bits.

Method 1 (1920 Encoded Bits and a Polar Encoder with N=2048)

In order to generate encoded bits of 1920 bits, a polar encoder with N=2048 may be configured. In the polar encoder, 30 bits may be arranged as information bits and 2018 bits may be arranged as frozen bits so as to perform polar encoding. The polar encoder generates 1920 bits by puncturing 128 bits out of 2048 encoded bits. The polar encoder divides the 1920 generated bits into 4 equal parts and transmits 480 bits in the respective corresponding subframes. In this case, the 480-bit blocks transmitted in the respective subframes may not be the same block. In other words, when PBCH is represented as PBCH_sub(1)+PBCH_sub(2)+PBCH_sub(3)+PBCH_sub(4) (PBCH is transmitted in each of four subframes), PBCH_sub(k), where k=1, 2, 3, 4, may be transmitted in 4 subframes as an encoded data block composed of 480 bits.

Method 2 (1920 Encoded Bits and a Polar Encoder with N=1024)

In order to generate encoded bits of 1920 bits, a polar encoder with N=1024 may be configured. In the polar encoder, 30 bits may be arranged as information bits and 994 bits may be arranged as frozen bits so as to perform polar encoding. The polar encoder generates 960 bits by puncturing 64 bits out of 1024 encoded bits, and repeats 960 bits once to generate 1920 bits. The polar encoder divides the 1920 generated bits into 4 equal parts and transmits 480 bits in the respective corresponding subframes. In other words, when PBCH is represented as PBCH_sub(1)+PBCH_sub(2)+PBCH_sub(3)+PBCH_sub(4), PBCH_sub(k), where k=1, 2, 3, 4, may be transmitted in 4 subframes as an encoded data block composed of 480 bits.

As a specific method of Method 2, Method 2-1 in which PBCH_sub(k), where k=1, 2, 3, 4, is configured with encoded data blocks formed by repeating 240 bits is proposed. As Method 2-2, data blocks encoded so as to satisfy the relationship of PBCH_sub(k)=PBCH_sub(l) and PBCH_sub(m)=PBCH_sub(n) (where k, l, m, n are not equal to each other) may be configured.

Method 2a

In order to generate encoded bits of 1920 bits, a polar encoder with N=1024 may be configured. In the polar encoder, 30 bits may be arranged as information bits and 994 bits may be arranged as frozen bits so as to perform polar encoding. The polar encoder generates 896 bits by puncturing 128 bits out of 1024 encoded bits, and concatenates 1024 bits and 896 bits to generate 1920 bits. The polar encoder divides the 1920 generated bits into 4 equal parts and transmits 480 bits in the respective corresponding subframes. In other words, when PBCH is represented as PBCH_sub(1)+PBCH_sub(2)+PBCH_sub(3)+PBCH_sub(4), PBCH_sub(k), where k=1, 2, 3, 4, may be transmitted in 4 subframes as an encoded data block composed of 480 bits.

Method 3 (1920 Encoded Bits and a Polar Encoder with N=512)

In order to generate encoded bits of 1920 bits, a polar encoder with N=512 may be configured. In the polar encoder, 30 bits may be arranged as information bits and 482 bits may be arranged as frozen bits so as to perform polar encoding. The polar encoder generates 480 bits by puncturing 32 bits out of 512 encoded bits, and repeats 480 bits four times to generate 1920 bits. The polar encoder divides the 1920 generated bits into 4 equal parts and transmits 480 bits in the respective corresponding subframes. In other words, when PBCH is represented as PBCH_sub(1)+PBCH_sub(2)+PBCH_sub(3)+PBCH_sub(4), PBCH_sub(k), where k=1, 2, 3, 4, may be transmitted in 4 subframes as an encoded data block composed of 480 bits. PBCH_sub(k) may be configured to be the same.

Method 3a

In order to generate encoded bits of 1920 bits, a polar encoder with N=512 may be configured. In the polar encoder, 30 bits may be arranged as information bits and 482 bits may be arranged as frozen bits so as to perform polar encoding. The polar encoder generates 448 bits by puncturing 64 bits out of 512 encoded bits, generates 960 bits by concatenating 512 bits and 448 bits, and repeats the same once to generate 1920 bits. The polar encoder divides the 1920 generated bits into 4 equal parts and transmits 480 bits in the respective corresponding subframes. In other words, when PBCH is represented as PBCH_sub(1)+PBCH_sub(2)+PBCH_sub(3)+PBCH_sub(4), PBCH_sub(k), where k=1, 2, 3, 4, may be transmitted in 4 subframes as an encoded data block composed of 480 bits.

Method 3b

In order to generate encoded bits of 1920 bits, a polar encoder with N=512 may be configured. In the polar encoder, 30 bits may be arranged as information bits and 482 bits may be arranged as frozen bits so as to perform polar encoding. The polar encoder generates 384 bits by puncturing 128 bits out of 512 encoded bits, and concatenates 1536 bits obtained by repeating 512 bits three times with the 384 bits to generate 1920 bits. The polar encoder divides the 1920 generated bits into 4 equal parts and transmits 480 bits in the respective corresponding subframes. In other words, when PBCH is represented as PBCH_sub(1)+PBCH_sub(2)+PBCH_sub(3)+PBCH_sub(4), PBCH_sub(k), where k=1, 2, 3, 4, may be transmitted in 4 subframes as an encoded data block composed of 480 bits.

Method 4 (1920 Encoded Bits and a Polar Encoder with N=256)

In order to generate encoded bits of 1920 bits, a polar encoder with N=256 may be configured. In the polar encoder, 30 bits may be arranged as information bits and 226 bits may be arranged as frozen bits so as to perform polar encoding. The polar encoder generates 240 bits by puncturing 16 bits out of 256 encoded bits, and repeats the 240 bits eight times to generate 1920 bits. The polar encoder divides the 1920 generated bits into 4 equal parts and transmits 480 bits in the respective corresponding subframes. In other words, when PBCH is represented as PBCH_sub(1)+PBCH_ sub(2)+PBCH_sub(3)+PBCH_sub(4), PBCH_sub (k), where k=1, 2, 3, 4, may be transmitted in 4 subframes as an encoded data block composed of 480 bits. PBCH_sub (k), where k=1, 2, 3, 4, may be configured to be the same, and a 240-bit encoded data block may be repeated.

Method 4a

In order to generate encoded bits of 1920 bits, a polar encoder with N=256 may be configured. In the polar encoder, 30 bits may be arranged as information bits and 226 bits may be arranged as frozen bits so as to perform polar encoding. The polar encoder generates 224 bits by puncturing 32 bits out of 256 encoded bits, generates 480 bits by concatenating 256 bits and the 224 bits, and then repeats the same 4 times to generate 1920 bits. The generated 1920 bits are divided into 4 equal parts and 480 bits are transmitted in the respective corresponding subframes. In other words, when PBCH is represented as PBCH_sub(1)+PBCH_sub(2)+PBCH_sub(3)+PBCH_sub(4), PBCH_sub(k), where k=1, 2, 3, 4, may be transmitted in 4 subframes as an encoded data block composed of 480 bits.

Method 4b

In order to generate encoded bits of 1920 bits, a polar encoder with N=256 may be configured. In the polar encoder, 30 bits may be arranged as information bits and 226 bits may be arranged as frozen bits so as to perform polar encoding. The polar encoder generates 128 bits by puncturing 128 bits out of 256 encoded bits and concatenates 1792 bits obtained by repeating 256 bits 7 times with 128 bits to generate 1920 bits. The polar encoder divides the generated 1920 bits into 4 equal parts and transmit 480 bits in the respective corresponding subframes. In other words, when PBCH is represented as PBCH_sub(1)+PBCH_sub(2)+PBCH_sub(3)+PBCH_sub(4), PBCH_sub(k), where k=1, 2, 3, 4, may be transmitted in 4 subframes as an encoded data block composed of 480 bits.

Method 5 (1920 Encoded Bits and a Polar Encoder with N=128)

In order to generate encoded bits of 1920 bits, a polar encoder with N=128 may be configured. In the polar encoder, 30 bits may be arranged as information bits and 98 bits may be arranged as frozen bits so as to perform polar encoding. The polar encoder generates 120 bits by puncturing 8 bits out of 128 encoded bits, and repeats the 120 bits 16 times to generate 1920 bits. The polar encoder divides the 1920 generated bits into 4 equal parts and transmits 480 bits in the respective corresponding subframes. In other words, when PBCH is represented as PBCH_sub(1)+PBCH_sub(2)+PBCH_sub(3)+PBCH_sub(4), PBCH_sub(k), where k=1, 2, 3, 4, may be transmitted in 4 subframes as an encoded data block composed of 480 bits. PBCH_sub (k), where k=1, 2, 3, 4, may be configured to be the same, and a 120-bit encoded data block may be repeated.

Method 5a

In order to generate encoded bits of 1920 bits, a polar encoder with N=128 may be configured. 30 bits may be arranged as information bits and 98 bits may be arranged as frozen bits so as to perform polar encoding. The polar encoder generates 112 bits by puncturing 16 bits out of 128 encoded bits, generates 240 bits by concatenating 128 bits and the 112 bits, and then repeats the same 8 times to generate 1920 bits. The polar encoder divides the 1920 generated bits into 4 equal parts and transmits 480 bits in the respective corresponding subframes. In other words, when PBCH is represented as PBCH_sub(1)+PBCH_sub(2)+PBCH_sub(3)+PBCH_sub(4), PBCH_sub(k), where k=1, 2, 3, 4, may be transmitted in 4 subframes as an encoded data block composed of 480 bits.

Method 5b

In order to generate encoded bits of 1920 bits, a polar encoder with N=128 may be configured. In the polar encoder, 30 bits may be arranged as information bits and 98 bits may be arranged as frozen bits so as to perform polar encoding. The 128 encoded bits are repeated 15 times to generate 1920 bits. The polar encoder divides the 1920 generated bits into 4 equal parts and transmits 480 bits in the respective corresponding subframes. In other words, when PBCH is represented as PBCH_sub(1)+PBCH_sub(2)+PBCH_sub(3)+PBCH_sub(4), PBCH_sub(k), where k=1, 2, 3, 4, may be transmitted in 4 subframes as an encoded data block composed of 480 bits.

Method 6

When the mother code size of the polar encoder is N and PBCH is represented as PBCH_sub(1)+PBCH_sub(2)+PBCH_sub(3)+PBCH_sub(4), PBCH_sub (k), where k=1, 2, 3, 4, may be configured to be the same and be transmitted. Each PBCH_sub(k) is generated by rate matching (e.g., puncturing or repetition) according to the information size of the PBCH and N. For example, when it is assumed that the PBCH coded bits are 3072 bits, N=512, and the information size is 64, 768 bits are transmitted on each PBCH_sub (k), and 256 bits may be selected from among the 512 bits, and 768 bits to be transmitted may be generated by concatenating the 512 bits and the 256 bits.

Method 6-1

When two OFDM symbols are used for PBCH transmission, the PBCH (PBCH_sub(k)) transmitted in subframe k may be generated so as to be the same for each OFDM symbol and transmitted. For example, when it is assumed that the PBCH coded bits are 3072 bits, N=512, and the information size is 64, 768 bits are transmitted on each PBCH_sub(k). In transmitting 384 bits on each of the two OFDM symbols, the communication device may generate 384 bits by puncturing 128 bits out of the 512 bits, and then transmit the same on each of the OFDM symbols.

Method 6-2

When two OFDM symbols are used for PBCH transmission, PBCH_sub(k) may be generated so as not to be the same for each OFDM symbol and then transmitted. When it is assumed that the PBCH coded bits are 3072 bits, N=512, and the information size is 64, 768 bits are transmitted on each PBCH_sub(k). In transmitting 384 bits on each of the two OFDM symbols, the communication device may select 256 bits from among the 512 bits, and then concatenate the 512 bits and the 256 bits to generate and transmit 768 bits.

Method 7

When the mother code size of the polar encoder is N and PBCH is represented as PBCH_sub(1)+PBCH_sub(2)+PBCH_sub(3)+PBCH_sub(4), the communication device may transmit the PBCH by generating PBCH_sub(k) (k=1, 2, 3, 4) such that at least two of PBCH_sub(k) are not the same. For example, when it is assumed that the PBCH coded bits are 3072 bits, N=512, and the information size is 64, 768 bits may be transmitted on each PBCH_sub (k). The communication device may select 256 bits from among the 512 bits, and then concatenate the 512 bits and the 256 bits to generate 768 bits to be transmitted. 768 bits are transmitted on PBCH_sub(k+1). Here, the communication device may select 256 bits which have not been selected in generating PBCH_sub (k), and concatenate the same with the 512 bits to generate and transmit 768 bits.

In brief, when PBCH is represented as PBCH_sub(1)+PBCH_sub(2)+PBCH_sub(3)+PBCH_sub(4) (where "+" denotes concatenation), and the PBCH coded bits transmitted on the OFDM symbols for transmitting PBCH_sub(k), where k=1, 2, 3, 4, are PBCH_sub(k_m), where k_m=0, 1, the following transmission schemes may be considered.

Transmission scheme 1: a PBCH transmission scheme in which PBCH_sub(k) is the same and PBCH_sub(k_m) is the same.

Transmission scheme 2: a PBCH transmission scheme in which PBCH_sub(k) is the same and PBCH_sub(k_m) is not the same.

Transmission scheme 3: a PBCH transmission scheme in which at least two of PBCH_sub(k) are not the same and PBCH_sub(k_m) is the same.

Transmission scheme 4: a PBCH transmission scheme in which at least two of PBCH_sub(k) are not the same and PBCH_sub(k_m) is not the same.

Figure 15:
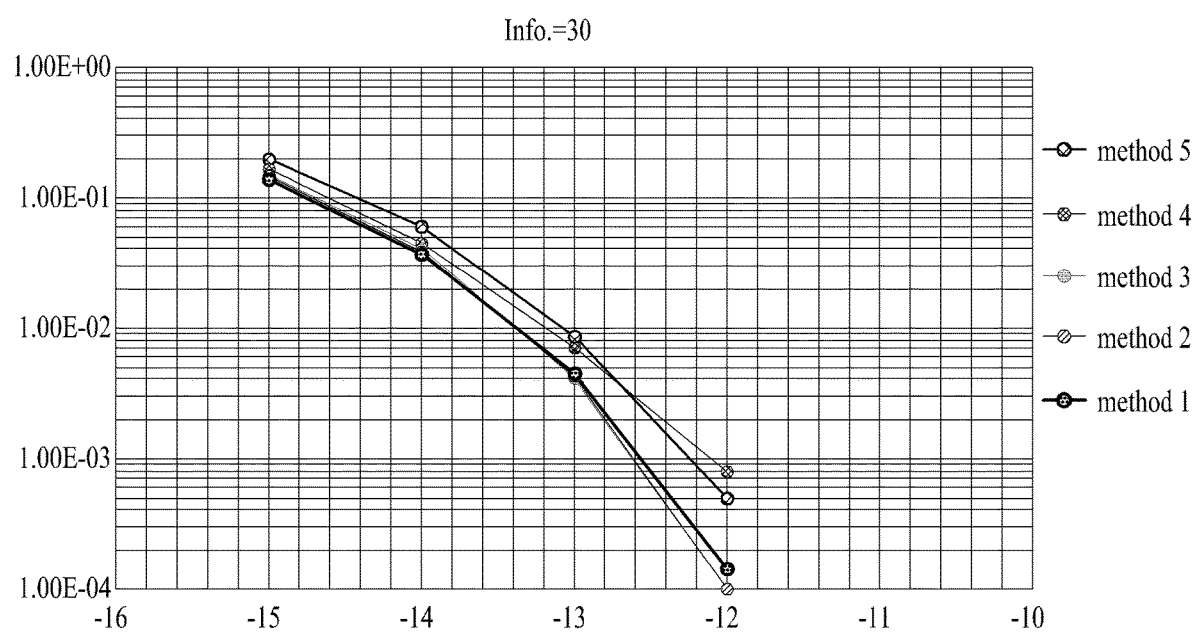
FIG. 15 is a chart comparing the performances according to Methods 1 to 5.

FIG. 15 is a chart comparing the performances according to Methods 1 to 5.

It can be seen from FIG. 15 that the performances of Method 1 and Method 2 are similar to each other. Method 2 is more advantageous than Method 1 in terms of decoder complexity because the mother code size of the polar encoder in Method 2 is small. Therefore, transmitting the PBCH as in Method 2 may be advantageous in terms of performance and complexity.

Figure 16:
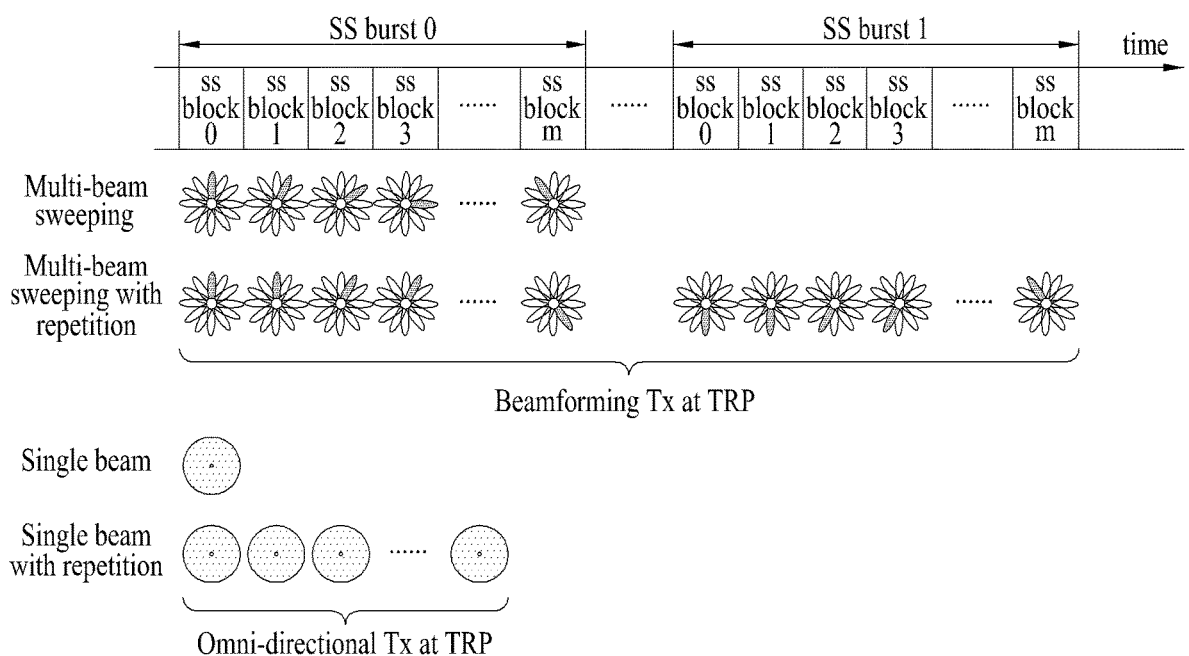
FIG. 16 illustrates a scheme of transmitting a synchronization signal in the New RAT (NR) system.

FIG. 16 illustrates a scheme of transmitting a synchronization signal in the New RAT (NR) system.

Referring to FIG. 16, in the NR system, the PBCH may be transmitted in an SS block in a SS (Synchronization Signal or Synchronization Sequence) burst. In this case, a plurality of SS blocks may be present in the SS burst, and each SS block may be limited to a specific beam. In this case, the UE should detect information (e.g., SS block index) about an SS block to which the SSCH burst belongs in the SS burst. If the UE is located at the boundary between two beams, combining the SS blocks may improve the detection performance of the PBCH. In this regard, the BS may indicate the SS block indexes to the UE to enable the UE to receive the PBCH. The SS block indexes may be indicated using the following methods.

Method 8

The BS may map the information corresponding to an SS block index and a scrambling sequence and scramble the same in PBCH encoded bits so as to be transmitted. The UE performs descrambling using a scrambling sequence generated on the assumption of a specific SS block index on the received PBCH, performs PBCH decoding, and then checks whether an error has occurred, using the CRC. If an error has occurred, the UE may perform descramble again using a scrambling sequence assuming a different SS block index from the previous operation, and then perform decoding to check whether an error has occurred. This operation, which is performed by performing decoding after descrambling with a scrambling sequence for all SS block indexes, continues until no error occurs. If the UE performs descrambling, this corresponds to an encoded bit in a case where the information data of signals transmitted in the SS blocks are the same, and accordingly the combining operation may be possible.

Method 9

The BS performs polar encoding on both information corresponding to an SS block index and other PBCH information together. The UE may perform decoding including combining through the following operations. It is assumed that the CRC is included when polar encoding is performed on the PBCH.

Step 1: Polar encoding may be performed assuming that the SS block index and/or CRC (generated using only the SS block index) is an information bit.

Step 2: The UE performs the XOR operation on the encoded bit generated in Step 1 and the received encoded bit. Assuming a bipolar signal, if the encoded bit generated in step 1 and the received signal have the same sign, only the sign of the received encoded bit is changed to a negative number. If they do not have the same sign, only the sign of the received signal is changed to a positive number. Once the XOR operation is performed, the effect of the SS block index on the encoded bits is not eliminated, and accordingly the UE may obtain the other information bits except for the SS block index through decoding.

Step 3: The UE may perform polar decoding on a signal obtained after performing the operation in Step 2. After performing decoding, the UE checks whether an error has occurred using the CRC.

Step 4: If an error has not occurred, it is assumed that the UE has successfully performed PBCH decoding. If an error has occurred, the following operation may be considered.

Step 4-1: The UE repeats the operations from step 1 again, assuming another SS block index.

Step 4-2: repeats the operations from step 1, assuming another SS block index. However, it may perform decoding after performing combining with a received signal obtained after the operation of step 2 for the previous SS block index before the decoding of step 3.

In Method 9, polar encoding may be performed on the SS block index and other PBCH information after positioning the SS block index information at an information bit location where reliability is lower than that of the other PBCH information. Since the information on the SS block index has been removed and thus is not present in the received signal obtained in step 3 of Method 9, the UE may perform decoding, considering the information as known information. Accordingly, optimum performance may be obtained by arranging the other PBCH information bits sequentially from the bit location having higher reliability, and then arranging the SS block index information. Actually, the UE may assume the information on the SS block index in step 2, and perform decoding in step 3, considering the information as known information.

The transmission scheme within one transmission period of the PBCH may depend on the frequency band and the subcarrier spacing. For example, 4 PBCH transmission occasions may be given in a frequency band below 3 GHz, 8 PBCH transmission occasions may be given in a frequency band between 3 GHz and 6 GHz, and 64 PBCH transmission occasions may be given in a frequency band above 6 GHz. When 4 PBCH transmission occasions are given, the transmission methods from Method 1 to Method 7 described above may be employed. When 8 transmission occasions are given, the following methods may be considered.

Method 10

In Method 10, the same four redundancy versions as 3 GHz is assumed. That is, PBCH=PBCH_sub(1)+PBCH_sub(2)+ . . . +PBCH_sub(7)+PBCH_sub(8). Here, PBCH_sub(k) (k=1, . . . , 8) denotes an encoded bit transmitted at the time of the k-th PBCH transmission.

Method 10-1

In Method 10-1, transmission is performed so as to satisfy the relation of PBCH_sub(k)=PBCH_sub((k+4) mod 4). That is, transmission is performed in order of PBCH_sub(1), PBCH_sub(2), PBCH_sub(3), PBCH_sub(4), PBCH_sub(1), PBCH_sub(2), PBCH_sub(3), and PBCH_sub(4).

Method 10-2

In Method 10-2, PBCH coded bits are transmitted by repeating PBCH_sub(k) twice in succession. That is, transmission is performed in order of PBCH_sub(1), PBCH_sub(1), PBCH_sub(2), PBCH_sub(2), PBCH_sub(3), PBCH_sub(3), PBCH_sub(4), and PBCH_sub(4).

Method 11

In Method 11, transmission is performed so as to satisfy the relation of PBCH_sub(k)=PBCH_sub(1). According to Method 11, PBCH_sub(1) is transmitted 8 times.

When 64 transmission occasions are given, the following methods may be considered.

Method 12

In Method 12, the same four redundancy versions as 3 GHz is assumed. That is, PBCH=PBCH_sub(1)+PBCH_sub(2)+PBCH_sub(3)+PBCH_sub(64). Here, PBCH_sub(k) (k=1, 8) is an encoded bit transmitted at the time of the k-th PBCH transmission.

Method 12-1

The BS may repeatedly transmit PBCH coded bits by repeating each of PBCH_sub(1), PBCH_sub(2), PBCH_sub(3), and PBCH_sub(4) 16 times in succession. For example, the BS performs transmission in order of PBCH_sub(1), . . . , PBCH_sub(1), PBCH_sub(2), . . . , PBCH_sub(2), PBCH_sub(3), . . . , PBCH_sub(3), PBCH_sub(4), . . . , PBCH_sub(4).

Method 12-2

The BS may transmit the PBCH coded bits by repeating each of PBCH_sub(1), PBCH_sub(2), PBCH_sub(3), and PBCH_sub(4) 8 times in succession and then perform the transmission again by repeating the same again in the same order. For example, the BS may transmit PBCH_sub(1), . . . , PBCH_sub(1), PBCH_sub(2), . . . , PBCH_sub(2), PBCH_sub(3), . . . , PBCH_sub(3), PBCH_sub(4), . . . , PBCH_sub(4) in this order, and then repeatedly transmit the same once more in the same order.

Method 12-3

The BS may transmit the PBCH coded bits by repeating each of PBCH_sub(1), PBCH_sub(2), PBCH_sub(3), and PBCH_sub(4) 4 times in succession and then perform the transmission again by repeating the same 3 times in the same order. For example, the BS may transmit PBCH_sub(1), . . . , PBCH_sub(1), PBCH_sub(2), . . . , PBCH_sub(2), PBCH_sub(3), . . . , PBCH_sub(3), PBCH_sub(4), . . . , PBCH_sub(4) in this order, and then repeatedly transmit the same 3 more times in the same order.

Method 12-4

The BS may transmit the PBCH coded bits by repeating each of PBCH_sub(1), PBCH_sub(2), PBCH_sub(3), and PBCH_sub(4) twice in succession and then perform the transmission again by repeating the same 7 times in the same order. For example, the BS may transmit PBCH_sub(1), . . . , PBCH_sub(1), PBCH_sub(2), . . . , PBCH_sub(2), PBCH_sub(3), . . . , PBCH_sub(3), PBCH_sub(4), . . . , PBCH_sub(4) in this order, and then repeatedly transmit the same 7 more times in the same order.

Method 12-5

The BS may transmit all of PBCH_sub(1), PBCH_sub(2), PBCH_sub(3), PBCH_sub(4) in this order, and then transmit the same 15 more times in the same order. For example, the BS may perform the transmission 16 times in the order of PBCH_sub(1), PBCH_sub(2), PBCH_sub(3), PBCH_sub(4), PBCH_sub(1), PBCH_sub(2), PBCH_sub(3), PBCH_sub(4), and the like.

Method 13

The BS may transmit the PBCH so as to satisfy the relation of PBCH_sub(k)=PBCH_sub(1). That is, the BS may transmit PBCH_sub(1) 64 times.

In an embodiment, when it is assumed that the PBCH information block size (including the CRC length) is 48 bits, the mother code rate of the polar code is $1/8$, the mother code size of the polar code is 512, and the number of resource elements (REs) that can be transmitted in one SS/PBCH block is 384, the BS may transmit 768 bits in one SS/PBCH block when the QPSK modulation scheme is applied. The BS may perform $1/8$ polar coding on the PBCH information block to generate 48*8=384 bits, which may be obtained by puncturing 128 bits in the mother code size. However, since 768 bits can be transmitted at the time of one PBCH transmission, 768 bits may be generated as shown in FIG. 17.

FIGS. 17A and 17B illustrate embodiments of a PBCH transmission scheme when four transmission occasions are given, and FIGS. 18A, 18B and 18C illustrate embodiments of a PBCH transmission scheme when eight transmission occasions are given.

In FIGS. 17A and 17B, the hatched cells represent a part of coded bits having the length of 128 bits, and PBCH_sub(k) (where k=1, 2, 3, 4) represents the coded bits transmitted at times of 4 PBCH transmissions.

For the polar code, the size of the encoded code block is limited to $2^n$ (where n is a natural number), and thus the rate matching operation of puncturing or repetition is required according to the transmission numerology of the system. It is assumed that the size of the encoded codeword for the data payload (including the CRC) generated in the higher layer satisfies the relation of $2^n<N<2^{n+1}$. The same method may be applied not only to the higher layer data, but also to the payload (e.g., DCI, UCI) transmitted on a control channel.

In this case, if there is a threshold THR1 and the codeword size is greater than the threshold THR1, encoding is performed by a mother polar encoder having the size of $2n^{+1}$ and then an encoded bit sequence having the codeword size N is created through puncturing of $2^{n+1}-N$ bits. In this case, the relation of the data payload size $K>2^n$ may be satisfied. On the other hand, if the size of the data payload is less than a threshold THR2, encoding is performed by a mother polar encoder having the size of $2^n$, and then an encoded bit sequence having the codeword size N is created through repetition corresponding to $N-2^n$ bits. In this case, the relation of the data payload size $K<2^n$ may be satisfied.

THR1 and THR2 may be different from each other. In this case, a threshold such as THR1/THR2 may have a different value depending on n. For example, when the codeword length is 200, the relation of $2^7<200<2^8$ is satisfied, and accordingly the polar encoder may perform repetition from a polar code whose length is 128 or puncturing from a polar code whose length is 256 to generate a codeword having length that is 200. However, when it is assumed that THR1=THR2=192, 200>192, and therefore the polar encoder may perform puncturing from a polar code of length that is 256 to generate a codeword whose length is 200.

Alternatively, when n<nc, the polar encoder may always generate a codeword through puncturing from the mother code whose size is $2^{n+1}$ When n>nc, a codeword may be generated using puncturing or repetition according to a threshold such as THR1/THR2.

Figure 19:
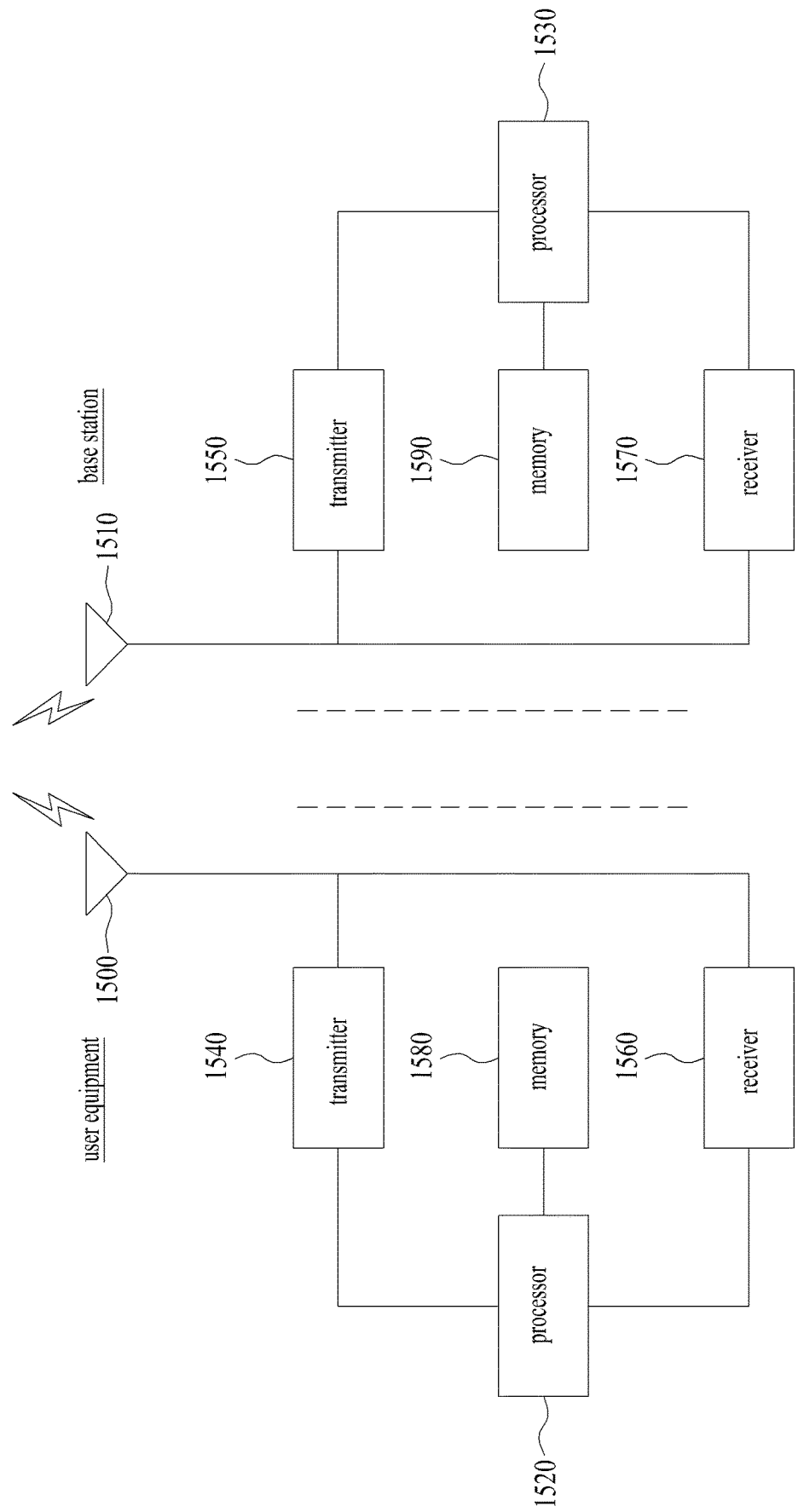
FIG. 19 illustrates an apparatus which has means that can implement the methods according to FIGS. 1 to 18.

Apparatuses illustrated in FIG. 19 are means that can implement the methods described before with reference to FIGS. 1 to 18.

A UE may act as a transmission end on a UL and as a reception end on a DL. A BS may act as a reception end on a UL and as a transmission end on a DL.

That is, each of the UE and the BS may include a Transmitter (Tx) 1540 or 1550 and Receiver (Rx) 1560 or 1570, for controlling transmission and reception of information, data, and/or messages, and an antenna 1500 or 1510 for transmitting and receiving information, data, and/or messages.

Each of the UE and the BS may further include a processor 1520 or 1530 for implementing the afore-described embodiments of the present invention and a memory 1580 or 1590 for temporarily or permanently storing operations of the processor 1520 or 1530.

The processor 1520 or 1530 may be called one of a controller, a microcontroller, a microprocessor, a microcomputer and the like. And, the processor 1520 or 1530 may be implemented using hardware, firmware, software and/or any combinations thereof. In the implementation by hardware, the processor 1520 or 1530 may be provided with such a device configured to implement the present disclosure as ASICs (application specific integrated circuits), DSPs (digital signal processors), DSPDs (digital signal processing devices), PLDs (programmable logic devices), FPGAs (field programmable gate arrays), and the like.

Meanwhile, in case of implementing the embodiments of the present disclosure using firmware or software, the firmware or software may be configured to include modules, procedures, and/or functions for performing the above-explained functions or operations of the present disclosure. And, the firmware or software configured to implement the present disclosure is loaded in the processor 1520 or 1530 or saved in the memory 1580/1590 to be driven by the processor 1520 or 1530.

In the present specification, although the processor 155/180 of the user equipment/base station performs an operation of processing signals and data except a function for the user equipment/base station 110/105 to receive or transmit a signal, for clarity, the processors 155 and 180 will not be mentioned in the following description specifically. In the following description, the processor 155/180 can be regarded as performing a series of operations such as a data processing and the like except a function of receiving or transmitting a signal without being specially mentioned.

Those skilled in the art will appreciate that the present invention may be carried out in other specific ways than those set forth herein without departing from the essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. It is obvious to those skilled in the art that claims that are not explicitly cited in each other in the appended claims may be presented in combination as an embodiment of the present invention or included as a new claim by a subsequent amendment after the application is filed.

INDUSTRIAL APPLICABILITY

A data transceiving method in a wireless access system according to the present invention is mainly described with reference to the examples of applying to 3GPP LTE system and IEEE 802 system and may be applicable to various kinds of wireless access systems.

What is claimed is:

1. A method for transmitting a physical broadcast channel (PBCH) by a base station, the method comprising:
   generating first encoded data bits and second encoded data bits using a polar code, wherein the first encoded data bits and the second encoded data bits are encoded data bits for each of two symbols of a predetermined subframe for PBCH transmission; and
   transmitting the first encoded data bits and the second encoded data bits on the PBCH at each of the two symbols of the predetermined subframe,
   wherein, based on a mother code size of a polar encoder being smaller than a sum of the first encoded data bits and the second encoded data bits, generating the first and second encoded data bits comprises:
   determining the first encoded data bits to be equivalent to the mother code size,
   determining the second encoded data bits to be equivalent to a difference between the mother code size and a size of the predetermined subframe, and
   concatenating the first encoded data bits and the second encoded data bits.

2. The method of claim 1, wherein generating the first and second encoded data bits comprises:
   generating each of the first encoded data bits and the second encoded data bits based on an information size of the PBCH and a mother code size of a polar encoder.

3. The method of claim 1, wherein the mother code size of the polar encoder is 512, and wherein the sum of the first encoded data bits and the second encoded data bits is 768.

4. A method for receiving a physical broadcast channel (PBCH) by a user equipment, the method comprising:
receiving generated encoded data bits on the PBCH at each of two symbols of a predetermined subframe,
wherein the generated encoded data bits are generated for each of the two symbols of the predetermined subframe for PBCH transmission using a polar code.

5. A base station configured to transmit a physical broadcast channel (PBCH), the base station comprising:
a polar encoder configured to generate first encoded data bits and second encoded data bits using a polar code, wherein the first encoded data bits and the second encoded data bits are encoded data bits for each of two symbols of a predetermined subframe for PBCH transmission; and
a transmitter configured to transmit the first encoded data bits and the second encoded data bits on the PBCH at each of the two symbols of the predetermined subframe,
wherein, based on a mother code size of the polar encoder being smaller than a sum of the first encoded data bits and the second encoded data bits, the polar encoder generates the first encoded data bits and the second encoded data bits by:
determining the first encoded data bits to be equivalent to the mother code size,
determining the second encoded data bits to be equivalent to a difference between the mother code size and a size of the predetermined subframe, and
concatenating the first encoded data bits and the second encoded data bits.

6. The base station of claim 5, wherein the polar encoder is configured to generate each of the first encoded data bits and the second encoded data bits based on an information size of the PBCH and the mother code size of the polar encoder.

7. The base station of claim 5, wherein the mother code size of the polar encoder is 512, and wherein the sum of the first encoded data bits and the second encoded data bits is 768.

8. A user equipment configured to receive a physical broadcast channel (PBCH), the user equipment comprising:
a receiver; and
a processor configured to control the receiver to receive generated encoded data bits on the PBCH at each of two symbols of a predetermined subframe,
wherein the generated encoded data bits are generated for each of the two symbols of the predetermined subframe for PBCH transmission using a polar code.

* * * * *